US012106805B2

United States Patent
Ziegler et al.

(10) Patent No.: US 12,106,805 B2
(45) Date of Patent: Oct. 1, 2024

(54) INCREASED PRECISION ANALOG CONTENT ADDRESSABLE MEMORIES

(71) Applicant: HEWLETT PACKARD ENTERPRISE DEVELOPMENT LP, Houston, TX (US)

(72) Inventors: Tobias Frederic Ziegler, Houston, TX (US); Ron M. Roth, Palo Alto, CA (US); Giacomo Pedretti, Cernusco sul Naviglio (IT); Luca Buonanno, Houston, TX (US); Pedro Henrique Rocha Bruel, Houston, TX (US); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 43 days.

(21) Appl. No.: 17/872,882

(22) Filed: Jul. 25, 2022

(65) Prior Publication Data
US 2024/0029792 A1    Jan. 25, 2024

(51) Int. Cl.
*G11C 15/04* (2006.01)
*G11C 16/10* (2006.01)
(Continued)

(52) U.S. Cl.
CPC ............ *G11C 15/04* (2013.01); *G11C 16/102* (2013.01); *G11C 16/12* (2013.01); *H03K 19/01742* (2013.01)

(58) Field of Classification Search
CPC ....... G11C 15/04; G11C 16/102; G11C 16/12; H03K 19/01742
See application file for complete search history.

(56) References Cited

U.S. PATENT DOCUMENTS

| 7,298,636 B1 * | 11/2007 | Wen .................... | G11C 15/04 |
| | | | 365/49.16 |
| 9,697,898 B2 | 7/2017 | Adams et al. | |

(Continued)

OTHER PUBLICATIONS

Pagiamtzis, K. et al., "Content-Addressable Memory (CAM) Circuits and Architectures: A Tutorial and Survey", IEEE Journal of Solid-State Circuits, vol. 41, No. 3, Mar. 2006, 16 pages.

*Primary Examiner* — Vanthu T Nguyen
(74) *Attorney, Agent, or Firm* — Dickinson Wright

(57) ABSTRACT

Examples increase precision for aCAMs by converting an input signal (x) received by a circuit into a first analog voltage signal ($V(x_{MSB})$) representing the most significant bits of the input signal (x) and a second analog voltage signal ($V(x_{LSB})$) representing the least significant bits of the input signal (x). By dividing the input signal (x) bit-wise into the first analog voltage signal ($V(x_{MSB})$) and the second analog voltage signal ($V(x_{LSB})$), the circuit can utilize aCAM sub-circuits implementing a combination of Boolean operations to search the input signal (x) against $2^{2*M}$ programmable levels, where "M" represents the number of programmable bits for each aCAM sub-circuit. Thus, using similar circuit hardware, example circuits square the number of programmable levels of conventional aCAMs (which generally only have $2^M$ programmable levels). Accordingly, examples provide new aCAMs that can carry out more complex computations than conventional aCAMs of comparable cost, size, and power consumption.

15 Claims, 9 Drawing Sheets

(51) Int. Cl.
   *G11C 16/12*      (2006.01)
   *H03K 19/017*     (2006.01)

(56) References Cited

U.S. PATENT DOCUMENTS

| | | |
|---|---|---|
| 10,847,238 B2 | 11/2020 | Li et al. |
| 10,998,047 B1 | 5/2021 | Li et al. |
| 11,017,857 B2 | 5/2021 | Gyllenskog |
| 11,289,162 B2 | 3/2022 | Strachan et al. |
| 11,587,623 B2 * | 2/2023 | Tseng .................. G11C 15/04 |
| 2022/0122646 A1 | 4/2022 | Graves et al. |

* cited by examiner

INCREASED PRECISION ANALOG CONTENT ADDRESSABLE MEMORIES

STATEMENT OF GOVERNMENT RIGHTS

This invention was made with government support under Contract No. W911NF2110355 awarded by the Army Research Office. The government has certain rights in the invention.

BACKGROUND

Content addressable memory ("CAM") is a type of computing memory in which stored data is searched by its content rather than its location. When a "word" is input to a CAM, the CAM searches for the word in its contents. If the CAM finds the word (i.e., "returns a match"), the CAM returns the address of the location where the found word resides. CAMs are powerful, efficient, and fast. However, CAMs are also relatively large, consume a lot of power, and are relatively expensive. Traditionally, these drawbacks have limited their applicability to select applications in which their power, efficiency, and speed are sufficiently desirable to outweigh their size, cost, and power consumption (here, the amount of circuit hardware, or number of CAM "cells" required to implement a CAM correlates with the size/cost/power consumption of the CAM). Accordingly, novel CAM designs that minimize the amount of circuit hardware/number of CAM cells required to maintain computational power, efficiency, and speed, are highly desirable. Analog CAMs ("aCAMs") are special types of CAMs that can store and search for ranges of values (in contrast to more traditional digital-based CAMs which can only store/search for zeros and ones) using the programmable conductance of memristors. For example, in a given aCAM cell, the conductance of a first memristor may be programmed to set the lower bound of a range, and the conductance of a second memristor may be programmed to set an upper bound of the range. The aCAM cell can perform a search to determine whether an input (e.g., an input analog voltage signal) falls within the programmed range defined by the conductance of the first and second memristors. If the input falls within the programmed range, the aCAM cell will return a match. If the input falls outside of the programmed range, the aCAM cell will return a mismatch.

Individual aCAM cells can be arranged into aCAM arrays consisting of rows and columns of aCAM cells. Words can be stored along the rows of the aCAM array (the rows of an aCAM array can be referred to as "match lines"), where each aCAM cell of a given row stores an entry of the stored word. When the aCAM array receives an input word (e.g., a series of analog voltage signals, each, representing an entry of the input word), the aCAM array can search for the input word, by entry, along the columns of the aCAM array (i.e., a first entry of the input word can be searched down a first column of the CAM array, a second entry of the input word can be searched down a second column of the CAM array, etc.). The aCAM array will "find" the input word in a given row if all the aCAM cells of the given row return a match for their respective entries of the input word.

BRIEF DESCRIPTION OF THE DRAWINGS

The present disclosure, in accordance with one or more various examples, is described in detail with reference to the following figures. The figures are provided for purposes of illustration only and merely depict examples.

DETAILED DESCRIPTION

Figure 1:
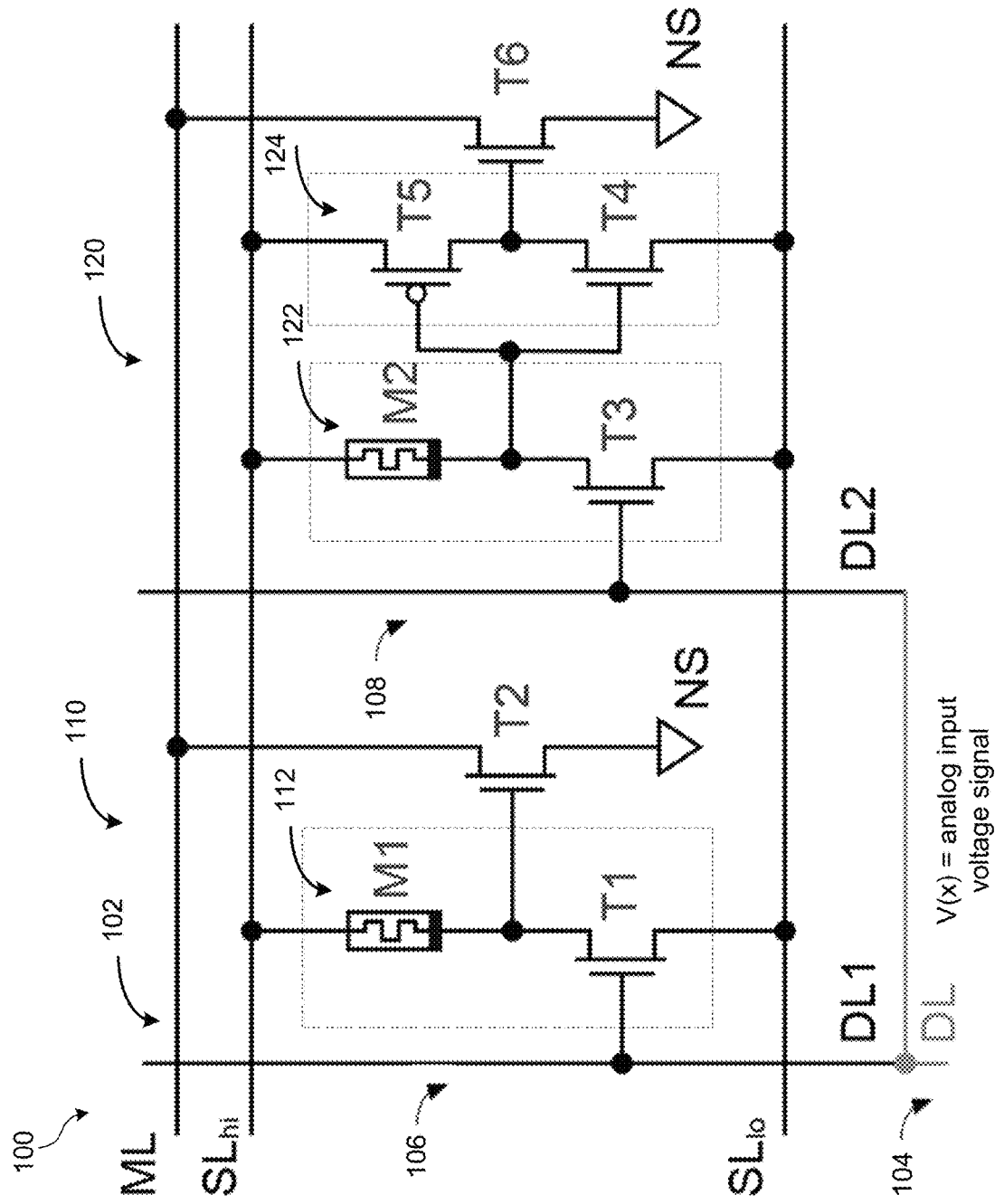
FIG. 1 depicts an example aCAM cell, in accordance with examples of the presently disclosed technology.

By natively performing searching/matching operations between an input word and internally stored words/patterns, an aCAM array can be used to carry out computations for various applications. At a high level, the more complex matching operations the aCAM array can perform, the more complex computations it can carry out. aCAM array designs that can carry out complex computations with minimal circuit hardware (e.g., a minimal number of aCAM cells) are highly desirable (as described above, by minimizing circuit hardware, aCAM array designs can minimize cost, size, and power consumption—thus improving their practicability for computational applications).

The complexity of searching/matching operations an aCAM array can perform (and by extension the complexity of computations it can be used to carry out) is limited by the number of unique values that its constituent cells can store/search for. The number of unique values an aCAM cell can store/search for may be referred to as a number of programmable levels for the aCAM cell, or a level of precision for the aCAM cell. A high precision aCAM (i.e., an aCAM with a higher number of programmable levels) will be able to carry out more complex computations than a low precision aCAM (i.e., an aCAM with a lower number of programmable levels).

A key limitation of aCAMs is that their precision is restricted by intrinsic structural limitations of their analog storage elements (i.e., conductance programmable memristors). In particular, due to intrinsic structural limitations/imperfections, memristors used in aCAMs can only be programmed to a finite/discrete number of conductance states (i.e., an M-bit memristor has $2^M$ programmable conductance states). For example, 2-bit memristors commonly used in aCAMs have 4 programmable conductance states (and 2 programmable bits). As described above, programmed conductances of two memristors can be used to set a lower boundary and upper boundary of a stored range for an aCAM cell (here the stored range may represent an entry of a stored word). As a consequence of their limited programmability, memristors can only be used to set range boundaries in a finite/discrete manner. This means that a typical aCAM cell will have a discrete/finite number of programmable levels. For example, a conventional aCAM cell utilizing two 2-bit memristors will only have $2^{M=2}=4$ programmable levels.

As alluded to above, due to their limited precision, aCAMs have limited capacity to carry out computations requiring higher degrees of complexity—which has limited their practical applicability. In other words, without cost prohibitive increases in size, conventional aCAMs have generally been unable to carry out complex computations that require searching an input against a high number of programmable levels (e.g., 16 levels, 256 levels, etc.).

Against this backdrop, examples of the presently disclosed technology provide new circuits that increase aCAM precision while minimizing circuit hardware. Moreover, examples are able to achieve such increased aCAM precision using the same precision-limited memristors as existing aCAMs.

A circuit of the presently disclosed technology may increase aCAM precision with limited circuit hardware additions by converting an input signal (x) received by the circuit into a first analog voltage signal ($V(x_{MSB})$) representing the most significant bits of the input signal (x) and a second analog voltage signal ($V(x_{LSB})$) representing the least significant bits of the input signal (x). By dividing the input signal (x) bit-wise into the first analog voltage signal ($V(x_{MSB})$) and the second analog voltage signal ($V(x_{LSB})$), the circuit can utilize aCAM sub-circuits implementing a combination of Boolean operations to search the input signal (x) against $2^{2*M}$ programmable levels, where "M" represents the number of programmable bits of memristors utilized in the aCAM sub-circuits, and by extension, each aCAM sub-circuit. Thus, using roughly the same amount and types of circuit hardware, circuits of the presently disclosed technology are able to square the number of programmable levels of conventional aCAMs (which generally only have $2^M$ programmable levels). Accordingly, examples of the presently disclosed technology provide new aCAMs that can carry out more complex computations than conventional aCAMs of comparable cost, size, and power consumption.

The manner in which circuits of the presently disclosed technology can square the number of programmable levels of conventional aCAMs can be explained using the following example/comparison.

The Conventional Approach:

A conventional approach might use a first aCAM cell (i.e. aCAM1) to perform a searching operation for an input signal (x). aCAM1 will have "M" programmable bits (i.e., the memristors in aCAM1 will each have "$2^M$" programmable conductance states—or M programmable bits). Accordingly, aCAM1 has $2^M$ programmable levels, and can search the input signal (x) against a range of $[0:2^M-1]$.

As an example, if M=2 (i.e., the memristors of aCAM1 are 2-bit memristors), aCAM1 will have $2^2=4$ programmable levels and can search a range of [0:3]. In other words, aCAM1 can search for:

i. x=0→or bitwise x=00
ii. x=1→or bitwise x=01
iii. x=2→or bitwise x=10
iv. x=3→or bitwise x=11

As described above, a problem with this conventional approach is that because memristors of aCAM1 only have $2^M=2$ programmable conductance states, aCAM1 only has 4 programmable levels. This means that aCAM1 would be unable to carry out a complex computation that would require aCAM1 to search the input signal (x) against, e.g., 16 programmable levels.

The New Approach of Examples of the Presently Disclosed Technology

Examples of the presently disclosed technology may increase the number of programmable levels for an aCAM "cell" with minimal circuit hardware additions—while assuming the same programmability limitations of memristors.

At a high level, examples can square the number programmable levels that input signal (x) can be searched against by: (1) converting input signal (x) into (a) a first analog voltage signal ($V(x_{MSB})$) representing the most significant bits of the input signal (x), and (b) a second analog voltage signal ($V(x_{LSB})$) representing the least significant bits of the input signal (x); (2) utilizing a first aCAM sub-circuit (e.g., aCAM1) to perform a searching operation for ($V(x_{MSB})$); and (3) utilizing a second aCAM sub-circuit (e.g., aCAM2) to perform a searching operation for ($V(x_{LSB})$). Further circuit-related implementational details will be described in conjunction with subsequent figures, but the following mathematical equations can be used to illustrate the concept.

First, examples can represent the input signal (x) using a bit-wise representation as follows:

$$x=2^M x_{MSB}+x_{LSB};$$

where x, $x_{MSB}$, and $x_{LSB}$ are integer values in the range $[0:2^M-1]$ Eq. 1

Here, ($x_{MSB}$) represents the most significant bits of the input signal (x) and ($x_{LSB}$) represents the least significant bits of the input signal (x). As described above, and as will be described in greater detail below, examples can construct circuits that convert input signal (x) into a first analog voltage signal ($V(x_{MSB})$) representing the most significant bits of input signal (x) and a second analog voltage signal ($V(x_{LSB})$) representing the least significant bits of input signal (x). However, for purposes of concept illustration, input signal (x) will continue to be represented as it is in Eq. 1.

As described above, a first aCAM sub-circuit (e.g., aCAM1—here aCAM1 may be the same aCAM cell utilized in the conventional approach example) may be used to perform search operations for ($x_{MSB}$), and a second aCAM sub-circuit (e.g., aCAM2—here aCAM2 may be the same/similar type of aCAM cell as aCAM1) may be used to perform search operations for ($x_{LSB}$).

As described above, aCAM1 has "M" programmable bits (i.e., the memristors in aCAM1 have "M" programmable bits and "$2^M$" programmable conductance states). Accordingly, aCAM1 has $2^M$ programmable levels, and can search a range of $[0:2^M-1]$.

If M=2 (i.e., the memristors of aCAM1 are 2-bit memristors), aCAM1 will have $2^2=4$ programmable levels and can search a range of [0:3]. In other words, aCAM1 can search for:

i. $x_{MBS}=0$→or bitwise $x_{MBS}=00$
ii. $x_{MBS}=1$→or bitwise $x_{MBS}=01$
iii. $x_{MBS}=2$→or bitwise $x_{MBS}=10$
iv. $x_{MBS}=3$→or bitwise $x_{MBS}=11$ Here, aCAM2 may be the same/similar type of aCAM cell as aCAM1, and may also have 2 programmable bits/4 programmable levels. Thus, aCAM2 can search for:

i. $x_{LBS}=0$→or bitwise $x_{LBS}=00$
ii. $x_{LBS}=1$→or bitwise $x_{LBS}=01$
iii. $x_{LBS}=2$→or bitwise $x_{LBS}=10$
iv. $x_{LBS}=3$→or bitwise $x_{LBS}=11$ A key distinction between this approach and the example conventional approach described above is that aCAM1 and aCAM2 are being used in combination to search a bit-wise divided version of the input signal (x) (i.e., aCAM1 is being used to search the most significant bits of the input signal (x) and aCAM2 is being used to search the least significant bits of the input signal (x)). This is in contrast to the conventional approach, where a single aCAM cell is used to search a non-bit-wise divided version of the input signal (x). By converting an N-bit input signal (x) into two (M=N/2)-bit components (i.e., ($x_{MSB}$) and ($x_{LSB}$)), examples can square the number of programmable levels the N-bit input signal (x) can be searched against using two conventional M-bit aCAM cells/sub-circuits. Thus, utilizing the two M-bit aCAM cells/sub-circuits (i.e., a first M-bit aCAM cells/sub-circuit that handles ($x_{MSB}$) and a second M-bit aCAM cell/sub-circuit that handles ($x_{LSB}$)), examples can search the N-bit input signal (x) against $2^{N=2M}$ programmable levels.

For example, even if aCAM1 and aCAM2 each only have 4 programmable levels, when utilized in combination in the manner described above, they can search a 4-bit input signal (x) against 16 (i.e., $2^{2*(M=2)}$) programmable levels. In other words, aCAM1 and aCAM2 can search 4-bit input signal (x) against:

i. x=0→or bitwise x=[00—searched by aCAM1, 00—searched by aCAM2]
ii. x=1→or bitwise x=[00—searched by aCAM1, 01—searched by aCAM2]
iii. x=2→or bitwise x=[00—searched by aCAM1, 10—searched by aCAM2]
iv. x=3→or bitwise x=[00—searched by aCAM1, 11—searched by aCAM2]
v. x=4→or bitwise x=[01—searched by aCAM1, 00—searched by aCAM2]
vi. x=5→or bitwise x=[01—searched by aCAM1, 01—searched by aCAM2]
vii. x=6→or bitwise x=[01—searched by aCAM1, 10—searched by aCAM2]
viii. x=7→or bitwise x=[01—searched by aCAM1, 11—searched by aCAM2]
ix. x=8→or bitwise x=[10—searched by aCAM1, 00—searched by aCAM2]
x. x=9→or bitwise x=[10—searched by aCAM1, 01—searched by aCAM2]
xi. x=10→or bitwise x=[10—searched by aCAM1, 10—searched by aCAM2]
xii. x=11→or bitwise x=[10—searched by aCAM1, 11—searched by aCAM2]
xiii. x=12→or bitwise x=[11—searched by aCAM1, 00—searched by aCAM2]
xiv. x=13→or bitwise x=[11—searched by aCAM1, 01—searched by aCAM2]
xv. x=14→or bitwise x=[11—searched by aCAM1, 10—searched by aCAM2]
xvi. x=15→or bitwise x=[11—searched by aCAM1, 11—searched by aCAM2]

In summary, by: (1) converting an input signal (x) into (a) a first analog voltage signal ($V(x_{MSB})$) representing the most significant bits of the input signal (x), and (b) a second analog voltage signal ($V(x_{LSB})$) representing the least significant bits of the input signal (x); (2) utilizing a first aCAM sub-circuit (e.g., aCAM1) to perform a searching operation for ($V(x_{MSB})$); and (3) utilizing a second aCAM sub-circuit (e.g., aCAM2) to perform a searching operation for ($V(x_{LSB})$)—examples can square the number of programmable levels that the input signal (x) can be searched against (i.e., $2^{2*(M)}$ programmable levels). However, as will be illustrated below, examples must address certain implementational challenges in order to achieve such precision gain.

As described above, aCAMs operate using thresholds. In other words, a given aCAM cell can be programmed such that it only returns a match for the input signal (x) when $T_L \leq x \leq T_H$, where ($T_L$) is a lower bound threshold of the given aCAM cell and ($T_H$) is an upper bound threshold of the given aCAM cell.

As described above, examples can represent the input signal (x) using the bitwise expression from Eq. 1. Examples can represent ($T_L$) and ($T_H$) in a similar manner, e.g.:

$$T_L = 2^M T_{L,MSB} + T_{L,LSB};$$

$$T_H = 2^M T_{H,MSB} + T_{H,LSB}$$

where $T_{L,MSB}$, $T_{L,LSB}$, $T_{H,MSB}$ and $T_{H,MSB}$ are integer values in the range $$[0:2^M-1] \qquad \text{Eq. 2}$$

Here, "M" again may represent the number of programmable bits for the given aCAM cell (i.e., the memristors of the given aCAM cell have "$2^M$" programmable conductance states, or "M" programmable bits).

As described above, the given aCAM cell can be programmed such that it only returns a match when $T_L \leq x \leq T_H$. Representing this matching operation using the bit-wise expressions of Eqs. 1 and 2, the given aCAM cell only returns a match when:

$$2^M T_{L,MSB} + T_{L,LSB} \leq 2^M x_{MSB} + x_{LSB} \geq 2^M T_{H,MSB} + T_{H,LSB}; \qquad \text{Eq. 3}$$

Formulating Boolean logical expressions from Eq. 3, examples can determine that the given aCAM cell only returns a match when:

$$[(T_{L,MSB} < x_{MSB}) \text{ OR} \{(T_{L,MSB} \leq x_{MSB}) \text{ AND } (T_{L,LSB} \leq x_{LSB})\}] \text{ AND}[(x_{MSB} < T_{H,MSB}) \text{ OR } \{(x_{MSB} \leq T_{H,MSB}) \text{AND}(x_{LSB} \leq T_{L,MSB})\}]; \qquad \text{Eq. 4}$$

Because aCAM cells can only implement "greater than or equal to" or "less than or equal to" expressions (as opposed to "less than" or "greater than" expressions), Eq. 4 can be rewritten as follows, where the given aCAM cell only returns a match when:

$$[(T_{L,MSB}+1 \leq x_{MSB}) \text{ OR} \{(T_{L,MSB} \leq x_{MSB}) \text{ AND } (T_{L,LSB} \leq x_{LSB})\}] \text{AND}[(x_{MSB} \leq T_{H,MSB}-1) \text{ OR}\{ (x_{MSB} \leq T_{H,MSB}) \text{ AND}(x_{LSB} \leq T_{L,MSB})\}]; \qquad \text{Eq. 5}$$

Here, it should be understood that because ($T_{L,MSB}$), ($x_{MSB}$), and ($T_{H,MSB}$) are integer values, the left sides of the "OR" operations for Eqs. 4 and 5 are equivalent.

The above analysis demonstrates that a circuit capable of performing the Boolean logical operations of Eq. 5 in response to receiving an input signal (x), can search an input signal (x) against $2^{2*M}$ levels as compared to a conventional aCAM cell, which could only search the input signal (x) against $2^M$ levels. Example circuits capable of performing the Boolean logical operations of Eq. 5 will be described in greater detail in the subsequent FIGS., but at a high level, examples may implement two types of circuits: (1) a first circuit type comprising three aCAM sub-circuits (e.g., aCAM1, aCAM2, and aCAM3) constructed to perform the Boolean logical operations of Eq. 5 in a single clock cycle; and (2) a second circuit type comprised of two aCAM sub-circuits (e.g., aCAM1, aCAM2) constructed to perform Boolean logical operations similar to those of Eq. 5 in two clock cycles. Utilizing either circuit type, examples of the presently disclosed technology can square the number of programmable levels of conventional aCAMs (which generally only have $2^M$ programmable levels), utilizing approximately the same amount/types of circuit hardware. Accordingly, examples of the presently disclosed technology provide aCAMs that can perform more complex computations than conventional aCAMs at comparable cost, size, and power consumption.

FIG. 1 depicts an example aCAM cell 100 that may be used to implement circuits of the presently disclosed technology. As described above, aCAM cell 100 can search an input signal (e.g., analog input voltage signal (V(x))) against a stored analog voltage range.

aCAM cell 100 includes a match line (i.e. ML 102) that may be pre-charged to a high voltage. As will be described below, aCAM cell 100 "returns a match" when the voltage across ML 102 remains high, and "returns a mismatch" when the voltage across ML 102 is discharged.

aCAM cell 100 also includes two data lines: DL1 106 and DL2 108 (running vertically in the example of FIG. 1) that are both electrically connected to an input data line: DL 104. aCAM cell 100 may receive an analog input voltage signal (V(x)) along DL 104 (here, analog input voltage signal (V(x)) may be an analog voltage signal that was converted from a digital input signal (x)). As depicted, DL1 106 and DL2 108 are both electrically connected to DL 104, and are electrically connected in parallel with respect to each other. Accordingly, analog input voltage signal (V(x)) may be applied along DL1 106 and DL2 108 respectively. As alluded to above, analog input voltage signal (V(x)) will eventually discharge ML 102 if analog input voltage signal (V(x)) is outside of the analog voltage range programmed in aCAM cell 100. Here, the analog voltage range stored by aCAM cell 100 is set/defined by programmed conductances of memristors M1 and M2, where the programmed conductance of memristor M1 sets/defines the lower bound of the stored analog voltage range and the programmed conductance of memristor M2 sets/defines the upper bound of the stored analog voltage range (see e.g., FIG. 2).

As depicted, aCAM cell 100 includes a "lower bound side" 110 and an "upper bound side" 120, so-called because memristors M1 and M2 are programmed to set the lower bound and the upper bound of the analog voltage range stored by aCAM cell 100, respectively.

Lower bound side 110 includes a transistor T1 and memristor M1 electrically connected to each other in series. Memristor M1, in conjunction with transistor T1, define a voltage divider sub-circuit 112. As depicted, voltage divider sub-circuit 112 generates a gate voltage (G1) across pull-down transistor T2. When the gate voltage (G1) across pull-down transistor T2 exceeds a threshold value, pull-down transistor T2 will turn on/activate and "pull-down" (i.e., discharge) the voltage across ML 102, returning a mismatch. As described above, the voltage across pull-down transistor T2 can be influenced by (1) the programmed conductance of memristor M1; and (2) analog input voltage signal (V(x)). In particular, when analog input voltage signal (V(x)) is greater than or equal to a threshold voltage (e.g., $T_L$), transistor T1 will become more conductive (the programmed conductance of memristor M1 will remain the same during the search operation) and thus the voltage between SL_hi and SL_lo (typically at GND) will drop across memristor M1, resulting in a small gate voltage (G1) that does not turn on/activate pull-down transistor T2, yielding a match result for lower bound side 110. Here, the value of ($T_L$) (i.e., the threshold voltage that will cause transistor T1 to become more conductive relative to memristor M1) can be programmed by programming the conductance of memristor M1. In this way, the programmed conductance of memristor M1 can be used to set the lower bound of the voltage range stored by aCAM cell 100.

Similar to lower bound side 110, upper bound side 120 includes a transistor T3 and memristor M2 electrically connected to each other in series. Memristor M2, in conjunction with the transistor T3, define a voltage divider sub-circuit 122. Upper bound side 120 differs slightly from lower bound side 110 because voltage divider sub-circuit 122 is electrically connected to an input of an inverter 124 (here the series combination of transistors T4 and T5 operate in conjunction to comprise inverter 124). Inverter 124 operates to invert the voltage output by voltage divider sub-circuit 122. Because pull-down transistor T6 is electrically connected to the output of inverter 124, the inverted voltage output by inverter 124 controls the gate voltage (G2) across pull-down transistor T6. Similar to above, when the gate voltage (G2) across pull-down transistor T6 exceeds a threshold value, pull-down transistor T6 will turn on/activate and "pull-down" (i.e., discharge) the voltage across ML 102, returning a mismatch. As described above, the voltage across pull-down transistor T6 can be influenced by (1) the programmed conductance of memristor M2; and (2) analog input voltage signal (V(x)). In particular, when analog input voltage signal (V(x)) is less than or equal to a threshold voltage (e.g., ($T_H$)), transistor T3 will not be highly conductive and thus the voltage between SL_hi and SL_lo (typically at GND) will remain high across transistor T3, resulting in a high voltage output for voltage divider sub-circuit 122. However, when this high voltage is inverted by inverter 124, the inverted (now low) voltage causes a low gate voltage (G2) that does not turn on/activate pull-down transistor T6, thus yielding a match result for upper bound side 120. Here, the value of ($T_H$) (i.e., the threshold voltage that will cause transistor T3 to not be highly conductive relative to memristor M2) can be programmed by programming the conductance of memristor M2. In this way, the programmed the conductance of memristor M2 can be used to set the upper bound of the voltage range stored by aCAM cell 100.

Figure 2:
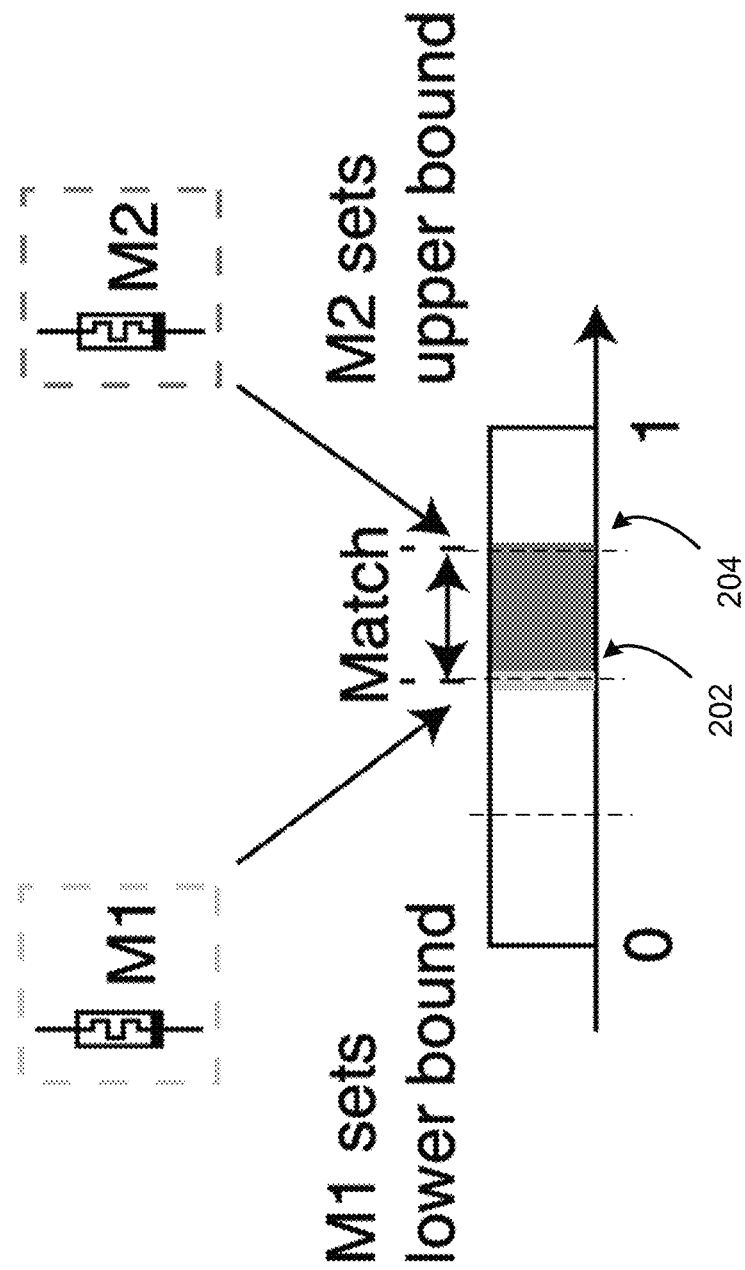
FIG. 2 depicts an example voltage range diagram, in accordance with examples of the presently disclosed technology.

FIG. 2 depicts an example diagram that illustrates how memristors M1 and M2 from aCAM cell 100 can be used to set the lower bound voltage 202 and the upper bound voltage 204 of the stored voltage range for aCAM cell 100. As depicted, aCAM cell 100 will only return a match for an analog input voltage signal (V(x)) when analog input voltage signal (V(x)) is within the voltage range defined by lower bound voltage 202 the upper bound voltage 204. As described above, the conductance of memristors M1 and M2 respectively can be programmed to set/define lower bound voltage 202 and upper bound voltage 204.

As described above, a limitation of aCAM cells (including aCAM cell 100) is that the memristors (e.g., memristors M1 and M2) they use to set/define stored voltage ranges can only be programmed to a discrete/finite number of conductance states. Leveraging the diagram of FIG. 2 for concept illustration, this means that lower bound voltage 202 and upper bound voltage 204 can only be placed in a discrete/finite number of locations (depicted for concept illustration by the vertical dashed lines). In turn, this limits the number of programmable levels that an aCAM cell (e.g., aCAM cell 100) can store/search for. As described above, and as will be described in greater detail below, examples of the presently disclosed technology provide new circuits that increase the number of programmable levels for aCAMs (e.g., increase the number of dashed vertical lines on FIG. 2 where lower and upper voltage bounds can be set) by converting an input signal (x) received by a circuit into a first analog voltage signal ($V(x_{MSB})$) representing the most significant bits of the input signal (x) and a second analog voltage signal ($V(x_{LSB})$)

representing the least significant bits of the input signal (x). By dividing the input signal (x) bit-wise into the first analog voltage signal (V($x_{MSB}$)) and the second analog voltage signal (V($x_{LSB}$)), the circuit can utilize aCAM sub-circuits (which may be the same/similar as aCAM cell 100) implementing a combination of Boolean operations to search the input signal (x) against $2^{2*M}$ programmable levels, where "M" represents the number of programmable bits for memristors utilized in the aCAM sub-circuits (here "M" also represents the number of programmable bits for each aCAM sub-circuit). Thus, using roughly the same amount and types of circuit hardware, circuits of the presently disclosed technology are able to square the number of programmable levels of conventional aCAMs (which generally only have $2^M$ programmable levels). Accordingly, examples of the presently disclosed technology provide aCAMs that can perform more complex computations than conventional aCAMs are approximately the same cost, size, and power consumption.

Figure 3:
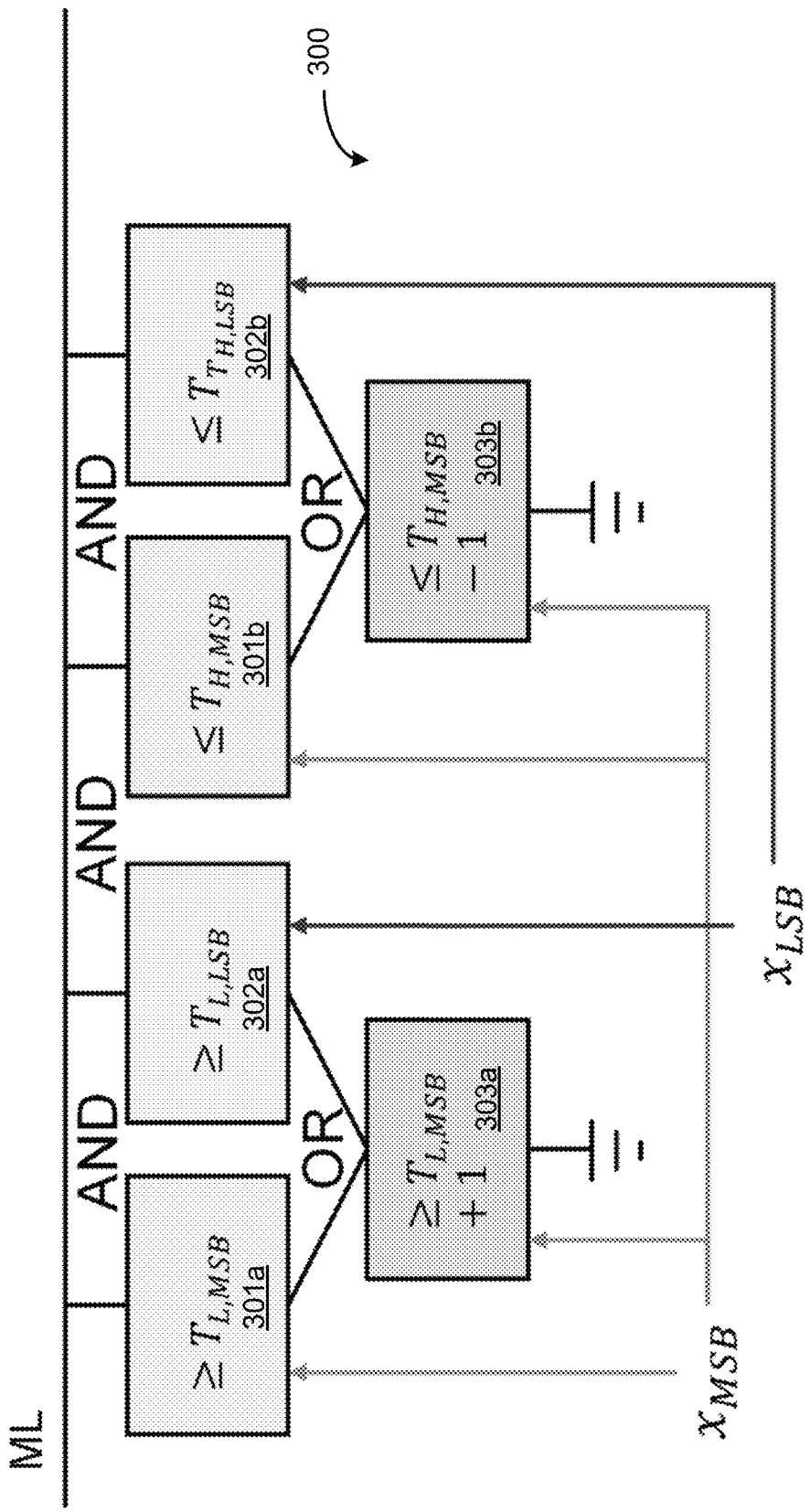
FIG. 3 depicts an example circuit diagram, in accordance with examples of the presently disclosed technology.

FIG. 3 depicts an example circuit diagram 300 that may be used to guide circuit designs, in accordance with various examples of the presently disclosed technology.

As described above, examples of the presently disclosed technology seek to increase the number of levels for an aCAM "cell" with minimal circuit hardware additions. At a high level, examples can square the number programmable levels that an input signal (x) can be searched against by (1) converting input signal (x) into a first analog voltage signal (V($x_{MSB}$)) representing the most significant bits of input signal (x) and a second analog voltage signal (V($x_{LSB}$)) representing the least significant bits of input signal (x).

As described in conjunction with FIGS. 1-2, aCAMs operate using thresholds. In other words, a given aCAM cell (e.g., aCAM cell 100) can be programmed to only return a match for input signal (x) when $T_L \le x \le T_H$, where ($T_L$) is a lower bound threshold of the given aCAM cell and ($T_H$) is an upper bound threshold of the given aCAM cell.

As described above, examples can represent the input signal (x), ($T_L$), and ($T_H$) using bitwise representations (see e.g., Eqs. 1-2 reproduced below).

$$x = 2^M x_{MSB} + x_{LSB};$$

where $x_{MSB}$, and $x_{LSB}$ are integer values in the range $[0:2^M-1]$ Eq. 1

$$T_L = 2^M T_{L,MSB} + T_{L,LSB};$$

$$T_H = 2^M T_{H,MSB} + T_{H,LSB}$$

where $T_{L,MSB}$, $T_{L,LSB}$, $T_{H,MSB}$ and $T_{H,MSB}$ are integer values in the range $[0:2^M-1]$ Eq. 2

As described above, using Eqs. 1-2 and Boolean logic, the matching operation $T_L \le x \le T_H$ can be rewritten in the form of Eq. 5 (reproduced below).

$$[(T_{L,MSB}+1 \le x_{MSB}) \quad \text{OR}\{(T_{L,MSB} \le x_{MSB}) \quad \text{AND} \\ (T_{L,LSB} \le x_{LSB})\}] \text{ AND}[(x_{MSB} \le T_{H,MSB}-1) \text{ OR}\{ \\ (x_{MSB} \le T_{H,MSB}) \text{ AND}(x_{LSB} \le T_{L,MSB})\}]; \quad \text{Eq. 5}$$

Here, the matching operation from Eq. 5 may be reformulated/rearranged as follows in Eq. 6 below.

$$\{[(x_{MSB} \ge T_{L,MSB}) \quad \text{AND}(x_{LSB} \ge T_{L,LSB})] \quad \text{OR}(x_{MSB} \ge \\ T_{L,MSB}+1)\} \text{ AND}\{[(x_{MSB} \le T_{H,MSB}) \text{ AND} \\ (x_{LSB} \le T_{H,LSB})] \text{ OR}(x_{MSB} \le T_{H,MSB}-1)\}; \quad \text{Eq. 6}$$

Here, an aCAM circuit can be programmed to only return a match under the conditions of Eq. 6.

Example circuit diagram 300 provides an abstract design for such an aCAM circuit.

In particular, block 301a evaluates whether $x_{MSB} \ge T_{L,MSB}$; block 302a evaluates whether $x_{LSB} \ge T_{L,LSB}$; block 303a evaluates whether $x_{MSB} \ge T_{L,MSB}+1$; block 301b evaluates whether $x_{MSB} \le T_{H,MSB}$; block 302b evaluates whether $x_{LSB} \le T_{H,LSB}$; and block 303b evaluates whether $x_{MSB} \le T_{H,MSB}-1$.

As depicted in FIG. 3, the blocks of circuit diagram 300 may be electrically connected in such a manner that they perform the Boolean operations of Eq. 6.

An example circuit that implements example circuit diagram 300 will be described in conjunction with FIG. 4. As will be described in greater conjunction with FIG. 4, such a circuit may comprise: (1) a first aCAM sub-circuit—electrically connected to a match line—that implements the matching operations of blocks 301a and 301b; (2) a second aCAM sub-circuit—electrically connected to the match line—that implements the matching operations of blocks 302a and 302b; and (3) a third aCAM sub-circuit—electrically connected to the first aCAM sub-circuit and the second aCAM sub-circuit-implements the matching operations of blocks 303a and 303b.

Figure 4:
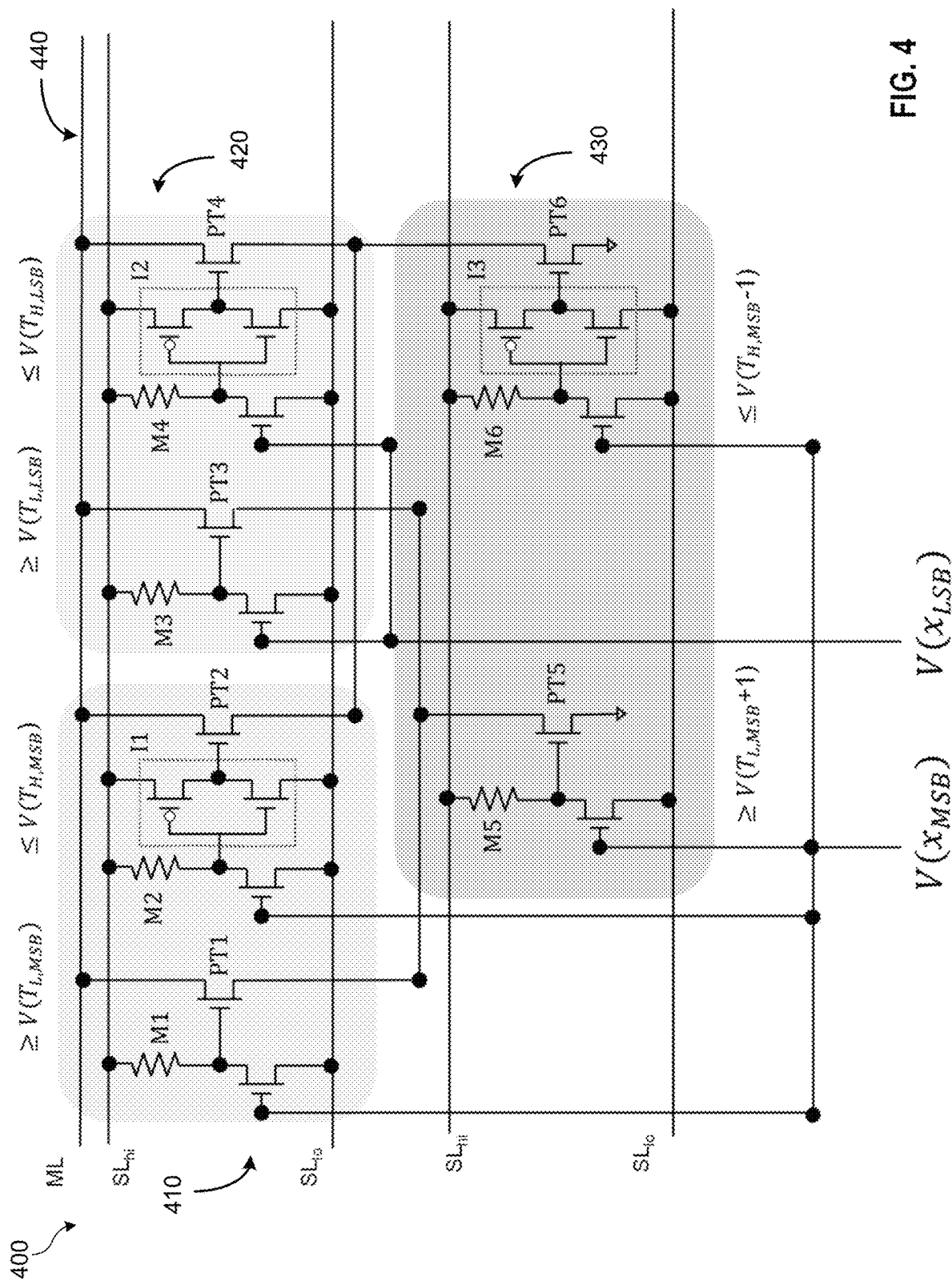
FIG. 4 depicts an example circuit, in accordance with examples of the presently disclosed technology.

FIG. 4 depicts an example circuit 400, in accordance with various examples of the presently disclosed technology.

Circuit 400 is comprised of 3 aCAM sub-circuits: aCAM subcircuit 410; aCAM sub-circuit 420; and aCAM sub-circuit 430. As depicted in the specific example of FIG. 4, each of aCAM sub-circuits 410-430 resembles aCAM cell 100, although this need not be the case.

As depicted, aCAM sub-circuit 410 is electrically connected to a match line (i.e., ML 440). aCAM sub-circuit 420 is also electrically connected to ML 440. aCAM sub-circuit 430 is electrically connected to aCAM sub-circuit 410 and aCAM sub-circuit 420 (the details of such connection will be described in greater detail below).

As depicted, both aCAM sub-circuit 410 and aCAM sub-circuit 430 receive an analog voltage signal (V($x_{MSB}$)) along their respective data lines. Analog voltage signal (V($x_{MSB}$)) may be an analog voltage signal that represents the most significant bits of an input signal (x) received by circuit 400 (as described above, the input signal (x) received by circuit 400 may be digital or analog). aCAM subcircuit 420 receives an analog voltage signal (V($x_{LSB}$)). Here analog voltage signal (V($x_{LSB}$)) may be an analog voltage signal that represents the least significant bits of the input signal (x) received by circuit 400. Where input signal (x) is a digital input signal, circuit 400 may convert the digital input signal (x) into the two analog voltage signals (i.e., analog voltage signals (V($x_{MSB}$)) and (V($x_{LSB}$))) representing the most significant bits and the least significant bits of the digital input signal (x) respectively.

aCAM sub-circuit 410 comprises two memristors: M1 and M2. As described in conjunction with FIG. 1, the conductance of memristor M1 may be programmed to set a lower bound threshold voltage (V($T_{L,MSB}$)) for aCAM sub-circuit 410. The conductance of memristor M2 may be programmed to set an upper bound threshold voltage (V($T_{H,MSB}$)) for aCAM subcircuit 410. Accordingly, aCAM subcircuit 410 can search analog voltage signal (V($x_{MSB}$)) against a stored range of voltages defined by lower bound threshold voltage (V($T_{L,MSB}$)) and (V($T_{H,MSB}$)).

As described in conjunction with FIG. 1, when analog voltage signal (V($x_{MSB}$)) is less than (V($T_{L,MSB}$)), pull-down transistor PT1 will be turned on/activated, however as will be described below, this alone will not be enough to discharge (i.e., "pull-down") the voltage across ML 440 (instead, pull-down transistor PT5 of aCAM sub-circuit 430 must also be turned on/activated). Similarly, when analog voltage signal ($V(x_{MSB})$) is greater than ($V(T_{H,MSB})$), pull-down transistor PT2 will be turned on/activated, however as will be described below, this alone will not be enough to discharge (i.e., "pull-down") the voltage across match line ML (instead, pull-down transistor PT6 of aCAM sub-circuit 430 must also be turned on/activated).

Here, aCAM sub-circuit 410 may be constructed in the same/similar manner as aCAM cell 100 where memristor M1 is electrically connected to a pull-down transistor PT1, and memristor M2 is electrically connected to an input of an inverter I1—where the output of inverter I1 is electrically connected to a pull-down transistor PT2. Pull-down transistors PT1 and PT2 are electrically connected to ML 440.

As alluded to above, ($T_{L,MSB}$) may be an integer value representing the lower bound threshold for aCAM sub-circuit 410. This integer value can be converted to a programmable conductance of memristor M1 using a function "f" that converts integer values to conductance values such that ($f(T_{L,MSB})$) is the programmed conductance value for memristor M1 that sets lower bound threshold ($T_{L,MSB}$). This programmed conductance value can then be converted into a lower bound threshold voltage for aCAM sub-circuit 410 using a function w that converts conductance values to voltage values. Accordingly, ($V(T_{L,MSB})$) may be equivalent to ($w(f(T_{L,MSB}))$). ($V(T_{H,MSB})$) may relate to ($T_{H,MSB}$) in a similar manner (i.e., $V(T_{H,MSB})=w(f(T_{H,MSB}))$).

aCAM sub-circuit 420 is constructed in the same/similar manner as aCAM sub-circuit 410. Accordingly, the conductance of memristor M3 may be programmed to set a lower bound threshold voltage ($V(T_{L,LSB})$) for aCAM subcircuit 420. The conductance of memristor M4 may be programmed to set an upper bound threshold voltage ($V(T_{H,LSB})$) for aCAM subcircuit 420. Accordingly, aCAM subcircuit 420 can search analog voltage signal ($V(x_{LSB})$) against a stored range of voltages defined by lower bound threshold voltage ($V(T_{L,LSB})$) and upper bound voltage ($V(T_{H,LSB})$). Similar to above, ($V(T_{L,LSB})$) may be equivalent to ($w(f(T_{L,LSB}))$), and ($V(T_{H,LSB})$) may be equivalent to ($w(f(T_{H,LSB}))$)—where f is a function that converts integer values to conductance values and w is a function that converts conductance values into voltage values.

aCAM sub-circuit 430 is constructed in the same/similar manner as aCAM sub-circuits 410 and 420. Accordingly, the conductance of memristor M5 may be programmed to set a lower bound threshold voltage ($V(T_{L,MSB}+1)$) for aCAM subcircuit 430. The conductance of memristor M6 may be programmed to set an upper bound threshold voltage ($V(T_{H,LSB}-1)$) for aCAM subcircuit 430. Accordingly, aCAM subcircuit 430 can search analog voltage signal ($V(x_{MSB})$) against a stored range of voltages defined by lower bound threshold voltage ($V(T_{L,MSB}+1)$) and upper bound threshold voltage ($V(T_{H,MSB}-1)$). Similar to above, ($V(T_{L,MSB}+1)$) may be equivalent to ($w(f(T_{L,MSB}+1))$), and ($V(T_{H,MSB}-1)$) may be equivalent to ($w(f(T_{H,MSB}-1))$)—where f is a function that converts integer values to conductance values and w is a function that converts conductance values into voltage values.

Here, it should be understood that instead of connecting to the ML 440, the pull-down transistors of aCAM sub-circuit 430 are electrically connected to the pull-down transistors of aCAM sub-circuits 410 and 420. In particular, pull-down transistor PT5 is electrically connected to (1) pull-down transistor PT1 of aCAM sub-circuit 410; and (2) pull-down transistor PT3 of aCAM sub-circuit 420. Pull-down transistor PT6 is electrically connected to (1) pull-down transistor PT2 of aCAM sub-circuit 410; and (2) pull-down transistor PT4 of aCAM sub-circuit 420.

Thus, the "pull-down logic" of circuit 400 is slightly different than that described for aCAM cell 100 of FIG. 1. In particular, circuit 400 will only discharge (i.e., "pull-down") the voltage across the ML 440 (i.e., return a mismatch) when: (a) pull-down transistor PT1 "AND" pull-down transistor PT5 are turned on/activated; and/or (b) pull-down transistor PT2 "AND" pull-down transistor PT6 are turned on/activated; and/or (c) pull-down transistor PT3 "AND" pull-down transistor PT5 are turned on/activated; and/or (d) pull-down transistor PT4 "AND" pull-down transistor PT6 are turned on/activated. Accordingly, based on the strategic electrical connections between aCAM sub-circuits 410-430, circuit 400 implements the Boolean logical expression of Eq. 6.

In particular, circuit 400 will only return a match when:

$$\{(V(x_{MSB}) \geq V(T_{L,MSB})) \text{ AND}(V(x_{LSB}) \geq V(T_{L,LSB})) \text{ OR}(V(x_{MSB}) \geq V(T_{L,LSB}+1))\} \text{ AND}\{(V(x_{MSB}) \leq V(T_{H,MSB})) \text{ AND}(V(x_{LSB}) \leq V(T_{H,LSB})) \text{ OR}(V(x_{MSB}) \leq V(T_{H,MSB}-1))\}; \quad \text{Eq. 7}$$

The above analysis demonstrates that a circuit such as circuit 400 that can: (1) convert an input signal (x) into two analog voltage signals (i.e., $V(x_{MSB})$ and $V(x_{LSB})$) representing the most significant bits and the least significant bits of the input signal (x) respectively; and (2) perform the matching operation of Eq. 7 on the converted signals, can search the input signal (x) against $2^{2*M}$ programmable levels (where "M" represents the number of programmable bits of memristors used in the circuit). Accordingly, circuit 400 (and circuits constructed utilizing the same/similar general principles) can essentially square the number of programmable levels of conventional aCAM cells which can only search a input signal (x) against $2^M$ programmable levels where "M" represents the number of programmable bits of memristors used in the conventional aCAM cell. Thus, using roughly the same amount and types of circuit hardware, circuit 400 can square the number of programmable levels of conventional aCAMs (which generally only have $2^M$ programmable levels). Accordingly, circuit 400 provides a circuit that can carry out more complex computations than conventional aCAMs of comparable cost, size, and power consumption.

Figure 5:
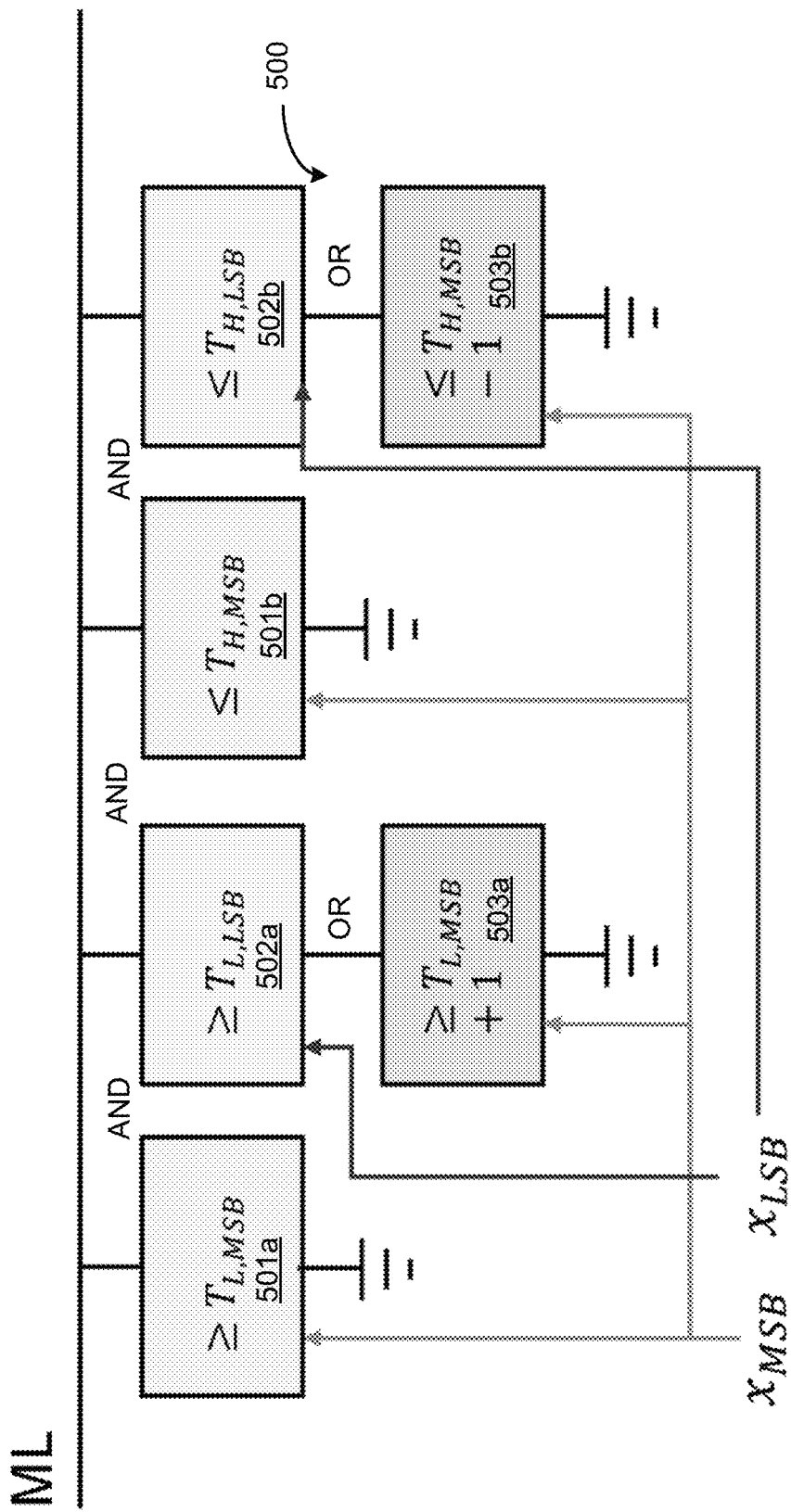
FIG. 5 depicts an example circuit diagram, in accordance with examples of the presently disclosed technology.

FIG. 5 depicts another example circuit diagram 500 that may be used to guide circuit designs, in accordance with various examples of the presently disclosed technology.

Circuit diagram 500 may be a variation of circuit diagram 300 from FIG. 3 based on a different re-formulation of Eq. 5, outlined below.

$$\{[(x_{MSB} \geq T_{L,MSB}+1) \text{ OR}(x_{LSB} \geq T_{L,LSB})] \text{ AND}(x_{MSB} \geq T_{L,MSB})\} \text{ AND}\{[(x_{MSB} \leq T_{H,MSB}-1) \text{ OR}(x_{LSB} \leq T_{H,LSB})] \text{ AND}(x_{MSB} \leq T_{H,MSB})\}; \quad \text{Eq. 8}$$

Here, an aCAM circuit can be programmed to only return a match under the conditions of Eq. 8.

Example circuit diagram 500 provides an abstract design for such an aCAM circuit.

In particular, block 501a evaluates whether $x_{MSB} \geq T_{L,MSB}$; block 502a evaluates whether $x_{LSB} \geq T_{L,LSB}$; block 503a evaluates whether $x_{MSB} \geq T_{L,MSB}+1$; block 501b evaluates whether $x_{MSB} \leq T_{H,MSB}$; block 502b evaluates whether $x_{LSB} \leq T_{L,LSB}$; and block 303b evaluates whether $x_{MSB} \leq T_{H,MSB}-1$.

As depicted in FIG. 5, the blocks of circuit diagram 500 may be electrically connected in such a manner that they perform the Boolean operations of Eq. 8.

An example circuit that implements example diagram 500 will be described in conjunction with FIG. 6. As will be described in greater conjunction with FIG. 6, such a circuit may comprise: (1) a first aCAM sub-circuit—electrically connected to a match line—that implements the matching operations of blocks 501a and 501b; (2) a second aCAM sub-circuit—electrically connected to the match line—that implements the matching operations of blocks 502a and 502b; and (3) a third aCAM sub-circuit—electrically connected to the second aCAM sub-circuit (and in some examples, also electrically connected to the match line)—that implements the matching operations of blocks 503a and 503b.

Figure 6:
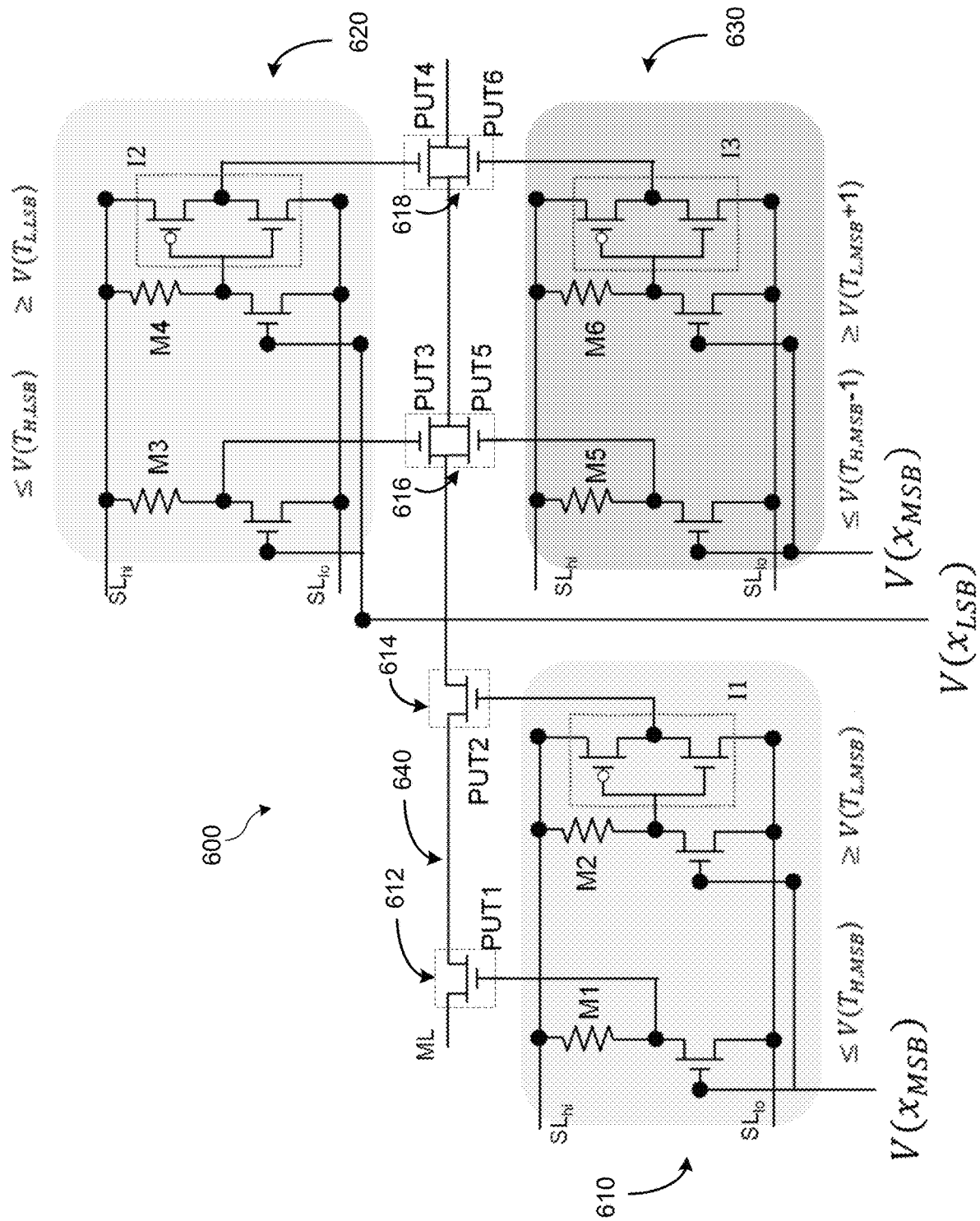
FIG. 6 depicts an example circuit, in accordance with examples of the presently disclosed technology.

FIG. 6 depicts an example circuit 600, in accordance with various examples of the presently disclosed technology.

As an initial note, circuit 600 utilizes "pull-up" transistors instead of "pull-down" transistors (pull-down transistors were utilized in example circuit 400). Accordingly, the logic for circuit 600 is different than the logic for circuit 400. In particular, the match line of circuit 600 (i.e., ML 640) is still pre-charged to a high voltage, but what is "pulled-up" by the pull-up transistors is a "reading node" (not depicted) on the right side of ML 640. If the pull-up transistors are turned on/activated, the voltage pre-charged on ML 640 (thanks to a pre-charge circuit connected on ML on the left side), will propagate to the right side of ML 640—returning a match. At a high level, what this means is that circuit 600 will only return a match when: (1) pull-up transistor PUT1 is activated (i.e., when at least pull-down transistor of pull-down transistor node 612 has been activated); "AND" (2) pull-up transistor PUT2 is activated (i.e., when at least pull-down transistor of pull-down transistor node 614 has been activated); "AND" (3) pull-up transistor PUT3 is activated "OR" pull-up transistor PUT5 is activated (i.e., when at least pull-down transistor of pull-down transistor node 616 has been activated); "AND" (4) pull-up transistor PUT4 is activated "OR" pull-up transistor PUT6 is activated (i.e., when at least pull-down transistor of pull-down transistor node 618 has been activated). It should be understood that example circuits similar to circuit 600 could be implemented using pull-down transistors instead. Likewise, example circuits similar to circuit 400 and circuit 800 (to be described in conjunction with FIG. 8) could be implemented using pull-up transistors.

Like circuit 400, circuit 600 is comprised of 3 aCAM sub-circuits: aCAM subcircuit 610; aCAM sub-circuit 620; and aCAM sub-circuit 630. As depicted in the specific example of FIG. 6, each of aCAM sub-circuits 610-630 resembles aCAM cell 100, although this need not be the case. For example, aCAM cell 100 includes pull-down transistors (and utilizes "pull-down" logic), where as depicted in the specific example of FIG. 6, the aCAM sub-circuits of circuit 600 include pull-up transistors (and utilize "pull-up" logic).

aCAM sub-circuit 610 is electrically connected to ML 640. aCAM sub-circuit 620 is also electrically connected to ML 640. aCAM sub-circuit 630 is electrically connected to aCAM sub-circuit 620. In the specific example of circuit 600, aCAM sub-circuit 630 is also electrically connected to ML 640, although this may not be the case in other examples. For instance, in example circuits that utilize pull-down transistors, the pull-down transistors of aCAM sub-circuit 630 could be electrically connected to pull-down transistors of aCAM sub-circuit 620 (where the pull-down transistors of aCAM sub-circuit 620 would be electrically connected to ML 640). Other example circuits could implement a reciprocal configuration the pull-down transistors of aCAM sub-circuit 620 would be electrically connected to the pull-down transistors of aCAM sub-circuit 630 (where the pull-down transistors of aCAM sub-circuit 630 would be electrically connected to ML 640).

As depicted, both aCAM sub-circuit 610 and aCAM sub-circuit 630 receive an analog voltage signal ($V(x_{MSB})$) along their respective data lines. Analog voltage signal ($V(x_{MSB})$) may be an analog voltage signal that represents the most significant bits of an input signal (x) received by circuit 600 (input signal (x) may be a digital input signal or an analog voltage signal). aCAM sub-circuit 620 receives an analog voltage signal ($V(x_{LSB})$). Here analog voltage signal ($V(x_{LSB})$) may be an analog voltage signal that represents the least significant bits of input signal (x) received by circuit 600. Where input signal (x) is a digital input signal, circuit 600 may convert the digital input signal (x) into two analog voltage signals (i.e., analog voltage signals ($V(x_{MSB})$) and ($V(x_{LSB})$)) representing the most significant bits and the least significant bits of the digital input signal (x) respectively.

aCAM sub-circuit 610 comprises two memristors: M1 and M2. In a similar but reciprocal example to that described in conjunction with FIG. 1, the conductance of memristor M1 may be programmed to set an upper bound threshold voltage ($V(T_{H,MSB})$) for aCAM sub-circuit 610 (here, because of the pull-up logic of circuit 600, memristor M1 is used to set the upper bound threshold voltage for aCAM sub-circuit 610 instead of the lower bound threshold voltage). The conductance of memristor M2 may be programmed to set an lower bound threshold voltage ($V(T_{L,MSB})$) for aCAM subcircuit 610. Accordingly, aCAM subcircuit 610 can search analog voltage signal ($V(x_{MSB})$) against a stored range of voltages defined by lower bound threshold voltage ($V(T_{L,MSB})$) and upper bound threshold voltage ($V(T_{H,MSB})$).

When analog voltage signal ($V(x_{MSB})$) is greater than or equal to ($V(T_{L,MSB})$), pull-up transistor PUT2 will be turned on/activated, and will charge (i.e., "pull-up") the voltage across ML 640, returning a match for pull-up transistor node 614 (depicted by the dashed line box around pull-down transistors PUT2). Similarly, when analog voltage signal ($V(x_{MSB})$) is less than or equal to ($V(T_{H,MSB})$), pull-up transistor PUT1 will be turned on/activated, and will charge (i.e., "pull-up") the voltage across ML 640, returning a match for pull-up transistor node 612 (depicted by the dashed line box around pull-down transistors PUT2).

Here, aCAM sub-circuit 610 may be constructed in the same/similar manner as aCAM cell 100 where memristor M1 is electrically connected to a pull-up transistor PUT1, and memristor M2 is electrically connected to an input of an inverter I1—where the output of inverter 11 is electrically connected to pull-up transistor PUT2. Pull-up transistors PUT1 and PUT2 are electrically connected to ML 640.

As described above, ($T_{L,MSB}$) may be an integer value representing the lower bound threshold for aCAM sub-circuit 610. This integer value can be converted to a programmable conductance of memristor M1 using a function "f" that converts integer values to conductance values such that (f($T_{L,MSB}$)) is the programmed conductance value for memristor M2 that sets lower bound threshold ($T_{L,MSB}$). This programmed conductance value can then be converted into a lower bound threshold voltage for aCAM sub-circuit 610 using a function w that converts conductance values to voltage values. Accordingly, ($V(T_{L,MSB})$) may be equivalent to (w(f($T_{L,MSB}$)). ($V(T_{H,MSB})$) may relate to ($T_{H,MSB}$) in a similar manner (i.e., $V(T_{H,MSB})$=w(f($T_{H,MSB}$)).

aCAM sub-circuit 620 is constructed in the same/similar manner as aCAM sub-circuit 610. Accordingly, the conductance of memristor M3 may be programmed to set an upper bound threshold voltage ($V(T_{H,LSB})$) for aCAM sub-circuit 620. The conductance of memristor M4 may be programmed to set an lower bound threshold voltage ($V(T_{L,LSB})$) for aCAM subcircuit 620. Accordingly, aCAM sub-circuit 620 can search analog voltage signal ($V(x_{LSB})$) against a stored range of voltages defined by lower bound threshold voltage ($V(T_{L,LSB})$) and upper bound voltage ($V(T_{H,LSB})$). Similar to above, ($V(T_{L,LSB})$) may be equivalent to ($w(f(T_{L,LSB}))$), and ($V(T_{H,LSB})$) may be equivalent to ($w(f(T_{H,LSB}))$)—where f is a function that converts integer values to conductance values and w is a function that converts conductance values into voltage values.

As alluded to above, when analog voltage signal ($V(x_{LSB})$) is greater than or equal to ($V(T_{L,LSB})$), pull-up transistor PUT4 will be turned on/activated, thus returning a match for pull-up transistor node 618. It should be understood that this will be true even if pull-up transistor PUT6—which pull-up transistor PUT4 is electrically connected to in parallel—is not activated. In this way, circuit 600 implements a logical "OR" operation between pull-up transistors PUT4 and PUT6. Similarly, when analog voltage signal ($V(x_{LSB})$) is less than or equal to ($V(T_{H,LSB})$), pull-up transistor PUT3 will be turned on/activated, thus returning a match for pull-up transistor node 618. Again, this will be true even if pull-up transistor PUT5—which pull-up transistor PUT3 is electrically connected to in parallel—is not activated. In this way, circuit 600 implements a logical "OR" operation between pull-up transistors PUT3 and PUT5.

aCAM sub-circuit 630 is constructed in the same/similar manner as aCAM sub-circuits 610 and 620. Accordingly, the conductance of memristor M5 may be programmed to set an upper bound threshold voltage ($V(T_{H,MSB}-1)$) for aCAM subcircuit 630. The conductance of memristor M6 may be programmed to set an lower bound threshold voltage (V ($T_{L,MSB}+1$)) for aCAM subcircuit 630. Accordingly, aCAM subcircuit 630 can search analog voltage signal ($V(x_{MSB})$) against a stored range of voltages defined by lower bound threshold voltage ($V(T_{L,MSB}+1)$) and ($V(T_{H,MSB}-1)$). Similar to above, ($V(T_{L,MSB}+1)$) may be equivalent to ($w(f(T_{L,MSB}+1))$, and ($V(T_{H,MSB}-1)$) may be equivalent to ($w(f(T_{H,MSB}-1))$)—where f is a function that converts integer values to conductance values and w is a function that converts conductance values into voltage values.

As alluded to above, when analog voltage signal ($V(x_{MSB})$) is greater than or equal to ($V(T_{L,MSB}+1)$), pull-up transistor PUT6 will be turned on/activated, thus returning a match for pull-up transistor node 618. It should be understood that this will be true even if pull-up transistor PUT4—which pull-up transistor PUT6 is electrically connected to in parallel—is not activated. In this way, circuit 600 implements a logical "OR" operation between pull-up transistors PUT6 and PUT4. Similarly, when analog voltage signal ($V(x_{MSB})$) is less than or equal to ($V(T_{H,MSB}-1)$), pull-up transistor PUT5 will be turned on/activated, thus returning a match for pull-up transistor node 616. Again, this will be true even if pull-up transistor PUT3—which pull-up transistor PUT5 is electrically connected to in parallel—is not activated. In this way, circuit 600 implements a logical "OR" operation between pull-up transistors PUT3 and PUT5.

In particular, circuit 800 will only return a match when:

$$\{(V(x_{MSB}) \geq V(T_{L,MSB}+1)) \text{ OR}(V(x_{LSB}) \geq V(T_{L,LSB})) \\ \text{AND}(V(x_{MSB}) \geq V(T_{L,MSB}))\} \text{ AND}\{(V(x_{MSB}) \leq V(T_{H,MSB}-1)) \text{ OR}(V(x_{LSB}) \leq V(T_{H,LSB})) \text{ AND}(V(x_{MSB}) \leq V(T_{H,MSB}))\}; \quad \text{Eq. 9}$$

Again stepping back, what does this all mean? It means that a circuit such as circuit 600 that can (1) convert an input signal (x) into two analog voltage signals (i.e., $V(x_{MSB})$ and $V(x_{LSB})$) representing the most significant bits and the least significant bits of the input signal (x) respectively; and (2) perform the matching operation of Eq. 9 on the converted signals—can search the input signal (x) against $2^{2*M}$ programmable levels (where "M" represents the number of programmable bits of memristors used in the circuit). Accordingly, circuit 600 (and circuits constructed utilizing the same/similar general principles) can essentially square the number of programmable levels of conventional aCAM cells which can only search a input signal (x) against $2^M$ programmable levels (where "M" represents the number of programmable bits of memristors used in the conventional aCAM cell). Accordingly, circuit 600 provides a circuit that can carry out more complex computations than conventional aCAMs of comparable cost, size, and power consumption.

Figure 7:
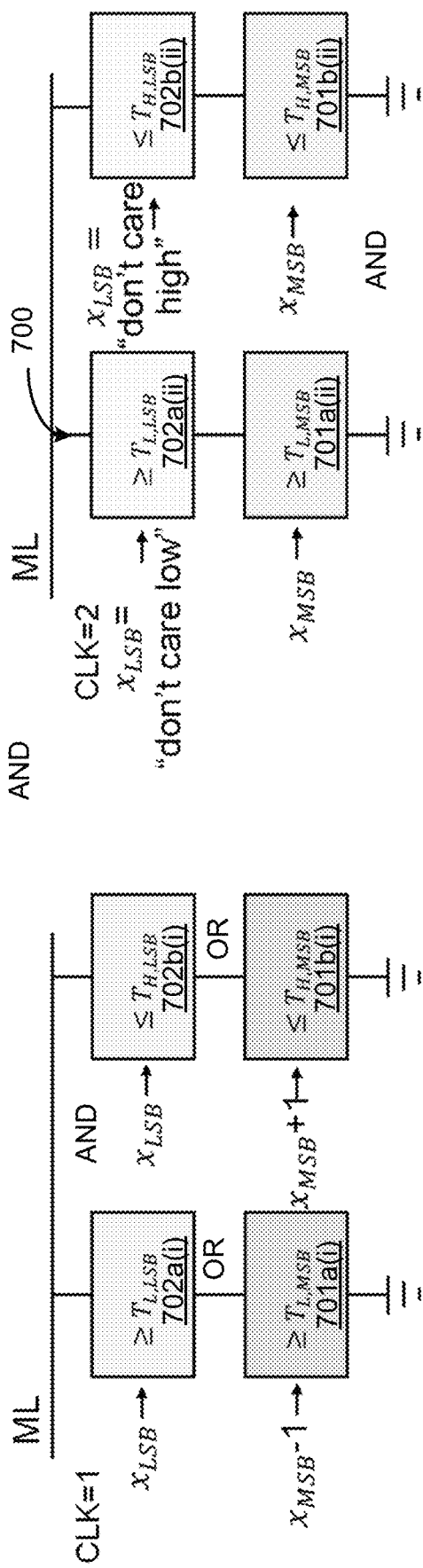
FIG. 7 depicts an example circuit diagram, in accordance with examples of the presently disclosed technology.

FIG. 7 depicts an circuit example diagram 700 that may be used to guide circuit designs, in accordance with various examples of the presently disclosed technology.

Figure 8:
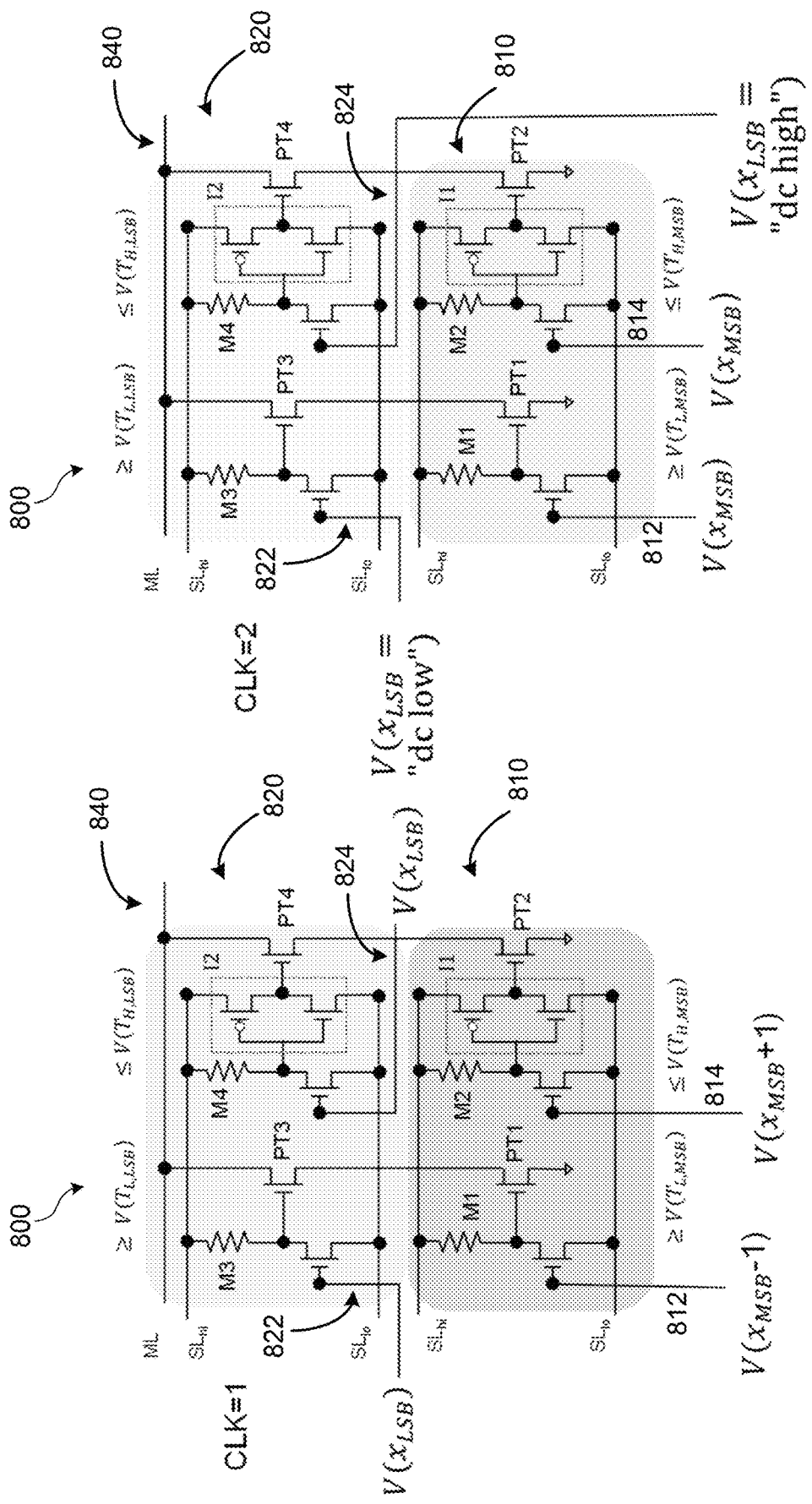
FIG. 8 depicts an example circuit, in accordance with examples of the presently disclosed technology.

Circuit diagram 700 is a variation of circuit diagram 500 from FIG. 5 that uses time-multiplexing and signal adjustment to reduce the number of aCAM sub-circuits/cells required to perform the Boolean operations of Eq. 8. In particular, example circuit 800 of FIG. 8 (implemented under the guiding principles of circuit diagram 700) provides an example circuit that performs the Boolean operations of Eq. 8 with only two aCAM sub-circuits. Thus, example circuit 800 (and other example circuits constructed in accordance with the guiding principles of diagram 700) can square the number of programmable levels an input signal (x) can be searched against by adding just a single aCAM sub-circuit/cell. Accordingly, example circuit 800 can provide further reductions in circuit cost, size, etc., while providing the same/similar computational power as the non-time multiplexing examples described above (here a potential drawback of the time multiplexing circuits of FIGS. 7-8 is that they may require more time to perform a computation as the searching operation will be performed in two clock cycles).

Referring again to FIG. 7, first, it may be noted that blocks 701a(i) and 701a(ii) represent the same threshold value (i.e., ($T_{L,MSB}$)) across two clock cycles. Likewise, blocks 701b(i) and 701b(ii) represent the same threshold value (i.e., ($T_{H,MSB}$)) across two clock cycles, blocks 702a(i) and 702a (ii) represent the same threshold value (i.e., ($T_{L,LSB}$)) across two clock cycles, etc.

Second, circuit diagram 700 provides an abstract design for a circuit that can perform the Boolean operations of Eq. 8 (reproduced below) with just two aCAM sub-circuits. As described above, in order to perform the Boolean operations of Eq. 8 with just two aCAM sub-circuits, the search operations of Eq. 8 may be performed across two clock cycles (i.e., CLK=1 and CLK=2).

$$\{[(x_{MSB} \geq T_{L,MSB}+1) \text{ OR}(x_{LSB} \geq T_{L,LSB})] \text{ AND}(x_{MSB} \geq T_{L,MSB})\} \text{ AND}\{[(x_{MSB} \leq T_{H,MSB}-1) \text{ OR}(x_{LSB} \leq T_{H,LSB})] \text{ AND}(x_{MSB} \leq T_{H,MSB})\}; \quad \text{Eq. 8}$$

Here, Eq. 8 includes 6 threshold values (i.e., ($T_{L,MSB}+1$), ($T_{L,LSB}$), ($T_{L,MSB}$), ($T_{H,MSB}-1$), ($T_{H,LSB}$), and ($T_{H,MSB}$)). However, a conventional aCAM cell/sub-circuit with two memristors can generally only store 2 threshold values (i.e., one lower bound threshold value and one upper bound threshold value). To reduce the number of threshold values in Eq. 8, Eq. 8 can be re-arranged as follows below:

$$[(x_{MSB}-1 \geq T_{L,MSB}) \text{ OR}(x_{LSB} \geq T_{L,LSB})] \text{ AND}[(x_{MSB}+1 \leq T_{H,MSB}) \text{ OR}(x_{LSB} \leq T_{H,LSB})] \text{ AND}(x_{MSB} \geq T_{L,MSB}) \text{ AND}(x_{MSB} \leq T_{H,MSB}); \quad \text{Eq. 9}$$

In Eq. 9, there are only four threshold values (i.e., ($T_{L,MSB}$), ($T_{L,LSB}$), ($T_{H,MSB}$), ($T_{H,LSB}$))—which as demonstrated above, can be stored in two aCAM sub-circuits/cells having two memristors each. However, there are now 4 input signal values (i.e., ($x_{MSB}$−1), ($x_{MSB}$), ($x_{MSB}$+1), and ($x_{LSB}$)) to be searched against. To address this new complication, examples utilize signal adjustments and time multiplexing to search the 4 input signal values of Eq. 9 utilizing just two aCAM sub-circuits.

As depicted in diagram 700, in the first clock cycle: block 701a(i) evaluates whether $x_{MSB}-1 \geq T_{L,MSB}$; block 701b(i) evaluates whether $x_{MSB}+1 \geq T_{H,MSB}$; block 702a(i) evaluates whether $x_{LSB} \geq T_{L,LSB}$; and block 702b(i) evaluates whether $x_{LSB} \leq T_{H,LSB}$. As described in the preceding FIGS., ($x_{MSB}$) may be an integer value representing the most significant bits of an input signal (x). Accordingly, ($x_{MSB}$−1) may be an integer value representing the most significant bits of an input signal (x)—reduced by 1. Similarly, ($x_{MSB}$+1) may be an integer value representing the most significant bits of an input signal (x)—increased by 1. As will be described in conjunction with FIG. 8, example circuits can perform these signal adjustments in either the digital or analog domains.

As depicted, blocks 701a(i) and 702a(i) are logically/electrically connected to perform a logical "OR" operation with respect to each other. Blocks 701b(i) and 702b(i) are likewise logically/electrically connected to perform a logical "OR" operation with respect to each other. The "a" and "b" blocks of circuit diagram 700 are both connected in parallel with the match line and thus perform a logical "AND" operation with respect to each other (i.e., both the combination of the "a" blocks and the combination of the "b" blocks must return a match for the input signal (x) to return a match).

Accordingly, in the first clock cycle, example circuit diagram 700 performs the bolded operations of Eq. 9 (reproduced below):

$$[(x_{MSB}-1 \geq T_{L,MSB}) \; \mathbf{OR} (x_{LSB} \geq T_{L,LSB})] \; \mathbf{AND} [(x_{MSB}+1 \leq T_{H,MSB}) \; \mathbf{OR} (x_{LSB} \leq T_{H,LSB})] \; \mathbf{AND} (x_{MSB} \geq T_{L,MSB}) \; \mathbf{AND} (x_{MSB} \leq T_{H,MSB}); \quad \text{Eq. 9(with bolding)}$$

Accordingly, the final two (i.e., the non-bolded) searching operations of Eq. 9 must be performed in the second clock cycle. Here, the final two (i.e., the non-bolded) searching operations of Eq. 9 do not include searches for ($x_{LSB}$) against threshold vales for ($x_{LSB}$) (i.e., threshold values ($T_{L,LSB}$) and ($T_{H,LSB}$)). To ensure that searching operations for ($x_{LSB}$) are effectively negated in the second clock cycle, examples can adjust the ($x_{LSB}$) signals received by blocks 702(a)(ii) and 702(b)(ii) in the second clock cycle to "don't care" values that always return a mismatch (i.e., a value less than ($T_{L,LSB}$) for block 702(a)(ii); and a value greater than ($T_{H,LSB}$) for block 702(a)(ii), where "M" is the number of programmable bits of the memristors used to set the threshold values). Accordingly, the only way that the two "a" blocks of circuit diagram 700 can return a match in the second clock cycle is if ($x_{MSB} \geq T_{L,MSB}$)—where block 701a(ii) receives ($x_{MSB}$) and block 702a(ii) receives ($x_{LSB}$="don't care low"). Similarly, the only way that the two "b" blocks of circuit diagram 700 can return a match in the second clock cycle is if ($x_{MSB} \leq T_{H,MSB}$)—where block 701b(ii) receives ($x_{MSB}$) and block 702a(ii) receives ($x_{LSB}$="don't care high"). In this way, circuit diagram 700 can perform the final two (i.e. non-bolded) search operations of Eq. 9 in the second clock cycle.

An example circuit 800 that implements example circuit diagram 700 will be described in conjunction with FIG. 8. As will be described in greater conjunction with FIG. 8, such a circuit may comprise: (1) a first aCAM sub-circuit—electrically connected to a match line—that implements the matching operations of the "701 blocks" (i.e., blocks 701a(i), 701b(i), 701a(ii), and 701b(ii)); and (2) a second aCAM sub-circuit—electrically connected to the first aCAM circuit—that implements the matching operations of the "702 blocks" (i.e., blocks 702a(i), 702b(i), 702a(ii), and 702b(ii)). Here, it should be understood than in other examples, the second aCAM sub-circuit may be electrically connected to the match line instead of the first aCAM circuit. In further examples (akin to the example of FIG. 6) both the first and second aCAM sub-circuits could be electrically connected to the match line, and electrically connected to each other in parallel.

FIG. 8 depicts an example circuit 800, in accordance with various examples of the presently disclosed technology.

Circuit 800 is comprised of 2 aCAM sub-circuits: aCAM subcircuit 810 and aCAM sub-circuit 820. As depicted in the specific example of FIG. 8, each of aCAM sub-circuits 810 and 820 resembles aCAM cell 100, although this need not be the case.

As depicted, aCAM sub-circuit 820 is electrically connected to a match line (i.e., ML 840). aCAM sub-circuit 810 is electrically connected to aCAM sub-circuit aCAM sub-circuit 820 (the details of such connection will be described in greater detail below).

aCAM sub-circuit 810 comprises two memristors: M1 and M2. The conductance of memristor M1 may be programmed to set a lower bound threshold voltage ($V(T_{L,MSB})$) for aCAM subcircuit 810. The conductance of memristor M2 may be programmed to set an upper bound threshold voltage ($V(T_{H,MSB})$) for aCAM subcircuit 810. Accordingly, aCAM subcircuit 810 can search analog voltage signals against a stored range of voltages defined by lower bound threshold voltage ($V(T_{L,MSB})$) and ($V(T_{H,MSB})$).

aCAM sub-circuit 820 also comprises two memristors: M3 and M4. The conductance of memristor M3 may be programmed to set a lower bound threshold voltage (V ($T_{L,LSB}$)) for aCAM subcircuit 820. The conductance of memristor M4 may be programmed to set an upper bound threshold voltage ($V(T_{H,LSB})$) for aCAM subcircuit 820. Accordingly, aCAM subcircuit 820 can search analog voltage signals against a stored range of voltages defined by lower bound threshold voltage ($V(T_{L,LSB})$) and ($V(T_{L,MSB})$).

Circuit 800 returns a match when the voltage across ML 840 remains charged (i.e., "not pulled-down"). Examples of the presently disclosed technology can leverage this fact by not re-charging ML 840 in between clock cycles (i.e., pre-charging ML 840 only once). Accordingly, the only way that ML 840 will remain charged after the first and second clock cycles is if a match is returned in both clock cycles. In this way, examples can naturally perform a logical "AND" operation between two clock cycles.

In the first clock cycle (i.e., CLK=1), aCAM sub-circuit 810 receives two analog voltage signals: ($V(x_{MSB}-1)$) and ($V(x_{MSB}+1)$). In particular, aCAM sub-circuit 810 receives analog voltage signal ($V(x_{MSB}-1)$) along a data line 812 electrically connected to the transistor that is electrically connected in series with memristor M1, and receives analog voltage signal ($V(x_{MSB}+1)$) along a data line 814 electrically connected to the transistor that is electrically connected in series with memristor M2.

As described in conjunction with FIG. 7, analog voltage signal ($V(x_{MSB}-1)$) may comprise an analog voltage signal that represents the most significant bits of an input signal (x) reduced by 1 (i.e., ($x_{MSB}-1$) is being represented as an analog voltage signal). Similarly, analog voltage signal (V($x_{MSB}$+1)) may comprise an analog voltage signal that represents the most significant bits of an input signal (x) increased by 1 (i.e., ($x_{MSB}$−1) is being represented as an analog voltage signal). As described above, circuit 800 may perform the signal adjustments required to convert input signal (x) into analog voltage signals (V($x_{MSB}$−1)) and (V($x_{MSB}$+1)) in either the digital or analog domains. For example, in the digital domain, an M—bit adder which adds or subtracts an integer value from ($x_{MSB}$) may be inserted before an digital-to-analog convert (DAC) that converts the digital components of input signal (x) into analog voltage signals. In the analog domain, a combination of operational amplifiers and resistors may be used to adjust the analog voltage signals after they have been converted from digital.

Referring again to FIG. 8, when analog voltage signal (V($x_{MSB}$−1)) is less than (V($T_{L,MSB}$)), pull-down transistor PT1 will be turned on/activated, however as will be described below, this alone will not be enough to discharge (i.e., "pull-down") the voltage across ML 840 (instead, pull-down transistor PT3 of aCAM sub-circuit 820 must also be turned on/activated). Similarly, when analog voltage signal (V($x_{MSB}$+1)) is greater than (V($T_{H,MSB}$)), pull-down transistor PT2 will be turned on/activated, however as will be described below, this alone will not be enough to discharge (i.e., "pull-down") the voltage across ML 840 (instead, pull-down transistor PT4 of aCAM sub-circuit 820 must also be turned on/activated).

Here, aCAM sub-circuit 810 may be constructed in the same/similar manner as aCAM cell 100 where memristor M1 is electrically connected to pull-down transistor PT1, and memristor M2 is electrically connected to an input of an inverter I1—where the output of inverter I1 is electrically connected to pull-down transistor PT2. Pull-down transistors PT1 and PT2 are electrically connected to aCAM sub-circuit 820. In particular, pull-down transistor PT1 is electrically connected to pull-down transistor PT3 of aCAM sub-circuit 820 and pull-down transistor PT2 is electrically connected to pull-down transistor PT4 of aCAM sub-circuit 820.

As alluded to above, ($T_{L,MSB}$) may be an integer value representing the lower bound threshold for aCAM sub-circuit 810. This integer value can be converted to a programmable conductance of memristor M1 using a function "f" that converts integer values to conductance values such that (f($T_{L,MSB}$)) is the programmed conductance value for memristor M1 that sets lower bound threshold ($T_{L,MSB}$). This programmed conductance value can then be converted into a lower bound threshold voltage for aCAM sub-circuit 810 using a function w that converts conductance values to voltage values. Accordingly, (V($T_{L,MSB}$)) may be equivalent to (w(f($T_{L,MSB}$)). (V($T_{H,MSB}$)) may relate to ($T_{H,MSB}$) in a similar manner (i.e., V($T_{H,MSB}$)=w(f($T_{H,MSB}$)).

In the first clock cycle (i.e., CLK=1), aCAM sub-circuit 820 receives analog voltage signal V($x_{LSB}$). In particular, aCAM sub-circuit 820 receives analog voltage signal V($x_{LSB}$) along a data line 822 electrically connected to memristor M3 and along a data line 824 electrically connected to memristor M4.

The conductance of memristor M3 may be programmed to set a lower bound threshold voltage (V($T_{L,LSB}$)) for aCAM subcircuit 820. The conductance of memristor M4 may be programmed to set an upper bound threshold voltage (V($T_{H,LSB}$)) for aCAM subcircuit 820. Accordingly, aCAM subcircuit 820 can search analog voltage signals against a stored range of voltages defined by lower bound threshold voltage (V($T_{L,LSB}$)) and upper bound voltage (V($T_{H,LSB}$)). Similar to above, (V($T_{L,LSB}$)) may be equivalent to (w(f ($T_{L,LSB}$)), and (V($T_{H,LSB}$)) may be equivalent to (w(f ($T_{H,LSB}$))—where f is a function that converts integer values to conductance values and w is a function that converts conductance values into voltage values.

Here, aCAM sub-circuit 820 is constructed in the same/similar manner as aCAM sub-circuit 810 where memristor M3 is electrically connected to pull-down transistor PT3, and memristor M4 is electrically connected to an input of an inverter I2—where the output of inverter I2 is electrically connected to a pull-down transistor PT4. Pull-down transistors PT3 and PT4 are electrically connected to ML 840. As described above, pull-down transistor PT3 is also electrically connected to pull-down transistor PT1 of aCAM sub-circuit 810 and pull-down transistor PT4 is also electrically connected to pull-down transistor PT2 of aCAM sub-circuit 810.

Thus, the "pull-down logic" of circuit 800 is slightly different than that described for aCAM cell 100 of FIG. 1. In particular, circuit 800 will only discharge (i.e., "pull-down") the voltage across ML 840 (i.e., return a mismatch) when: (a) pull-down transistor PT1 "AND" pull-down transistor PT3 are turned on/activated; and/or (b) pull-down transistor PT2 "AND" pull-down transistor PT4 are turned on/activated.

In particular, during the first clock cycle (i.e., CLK=1), circuit 800 will only return a match when:

$$\{(V(x_{MSB}-1) \geq V(T_{L,MSB})) \text{ OR}(V(x_{LSB}) \geq V(T_{L,LSB}))\} \\ \text{AND}\{(V(x_{MSB}+1) \leq V(T_{H,MSB})) \text{ OR}(V(x_{LSB}) \leq V(T_{H,LSB}))\};$$  Eq. 10

Here, it should again be noted that in the first clock cycle, circuit 800 has not yet completed the entire search operation of Eq. 9. In particular, circuit 800 must still search ($x_{MXB}$) against thresholds ($T_{L,MSB}$) and ($T_{H,MSB}$) respectively. As will be described below, this searching operation will be performed in the second clock cycle (i.e. CLK=2).

Before describing the second clock cycle, the potential results of the first clock cycle should be mentioned. First, if the first clock cycle returns a mismatch for input signal (x), then it does not matter what result the second clock cycle returns (i.e., even if the second clock cycle returns a match, the full search operation for input signal (x) will return a mismatch because of the mismatch returned in the first clock cycle). Accordingly, in various examples, if circuit 800 returns a mismatch in the first clock cycle (i.e., discharges/pull-down the voltage across ML 840), it may not perform the search operations of the second clock cycle, thereby reducing computation time and potentially saving power consumption. Second, if the first clock cycle returns a match for input signal (x), then it does matter what result the second clock cycle returns (i.e., if the second clock cycle returns a mismatch, then the input signal (x) returns an overall mismatch, but if the second clock cycle returns a match, then input signal (x) returns an overall match). As described above, circuit 800 returns a match when the voltage across ML 840 remains charged (i.e., "not pulled-down"). Examples of the presently disclosed technology can leverage this fact by not re-charging ML 840 in between clock cycles. Accordingly, the only way that ML 840 will remain charged after the first and second clock cycles is if a match is returned in both clock cycles. In this way, examples can perform a logical "AND" operation between cycles, which realizes the full search operation of Eq. 9.

Referring now to the second clock cycle, in the second clock cycle (i.e., CLK=2), aCAM sub-circuit 810 receives analog voltage signal (V($x_{MSB}$)) along data lines 812 and 814 respectively. Here analog voltage signal (V($x_{MSB}$)) may be analog voltage signal that represents the most significant bits of input signal (x) (here, unlike the first clock cycle, ($x_{MSB}$) is not being reduced or increased when represented as an analog voltage signal).

When analog voltage signal (V($x_{MSB}$)) is less than (V($T_{L,MSB}$)), pull-down transistor PT1 will be turned on/activated. As will be described below, unlike in the first clock cycle, when pull-down transistor PT1 is turned on/activated in the second clock cycle, this will always discharge ML 840 because the analog voltage signals received by aCAM sub-circuit 820 in the second clock cycle will be set such that they always turn-on/activate the pull-down transistors of aCAM sub-circuit 820. Similarly, when analog voltage signal (V($x_{MSB}$)) is greater than (V($T_{H,MSB}$)), pull-down transistor PT2 will be turned on/activated. As will be described below, unlike in the first clock cycle, when pull-down transistor PT2 is turned on/activated in the second clock cycle, this will always discharge ML 840 because the analog voltage signals received by aCAM sub-circuit 820 in the second clock cycle will be set such that they always turn-on/activate the pull-down transistors of aCAM sub-circuit 820.

As described in conjunction with FIG. 7, to ensure that searching operations for ($x_{LSB}$) are effectively negated in the second clock cycle, examples can adjust the ($x_{LSB}$)-related signals received aCAM sub-circuit 820 during the second clock cycle to "don't care" values that always return a mismatch. Accordingly, aCAM sub-circuit 820 may receive analog voltage signal (V($x_{LSB}$="don't care low")) (i.e., an analog voltage signal decreased below (V($T_{L,LSB}$))) along data line 822 (which is electrically connected to the lower bound threshold side of aCAM sub-circuit 820) and receive analog voltage signal (V($x_{LSB}$="don't care high")) (i.e., an analog voltage signal increased above (V($T_{H,LSB}$))) along data line 824 (which is electrically connected to the upper bound threshold side of aCAM sub-circuit 820). As described above, (V($x_{LSB}$="don't care low")) may be an analog voltage signal reduced below (V($T_{L,LSB}$)) and (V($x_{LSB}$="don't care high")) may be an analog voltage signal increased above (V($T_{H,LSB}$)).

Thus, a circuit such as circuit 800 can: (1) convert, in a first clock cycle, an input signal (x) into three analog voltage signals (i.e., V($x_{MSB}$−1), V($x_{MSB}$+1) and V($x_{LSB}$)) representing: (a) the most significant bits of the input voltage signal (x) reduced by 1; (b) the most significant bits of the input voltage signal (x) increased by 1; and (c) the least significant bits of the input voltage signal (x); (2) perform the bolded matching operations of Eq. 9 on the converted first clock cycle signals; (3) convert, in a second clock cycle, the input signal (x) into three different analog voltage signals (i.e., (V($x_{MSB}$)), (V($x_{LSB}$="don't care low") and (V($x_{LSB}$="don't care high")) representing: (d) the most significant bits ($x_{MSB}$) of the input voltage signal (x); (e) the least significant bits of the input voltage signal (x) set to a low "don't care" value; and (f) the least significant bits ($x_{LSB}$) of the input voltage signal (x) set to a high "don't care" value; and (4) perform the non-bolded matching operations of Eq. 9 on the converted second clock cycle signals—can search the input signal (x) against $2^{2*M}$ programmable levels (where "M" represents the number of programmable bits of memristors used in the circuit). Accordingly, circuit 800 (and circuits constructed utilizing the same/similar general principles) can essentially square the number of programmable levels of conventional aCAM cells which can only search an input signal (x) against $2^M$ programmable levels where "M" represents the number of programmable bits of memristors used in the conventional aCAM cell. Thus, using roughly the same amount and types of circuit hardware, circuit 800 can square the number of programmable levels of conventional aCAMs (which generally only have $2^M$ programmable levels). Accordingly, circuit 800 provides a circuit that can carry out more complex computations than conventional aCAMs of comparable cost, size, and power consumption.

Figure 9:
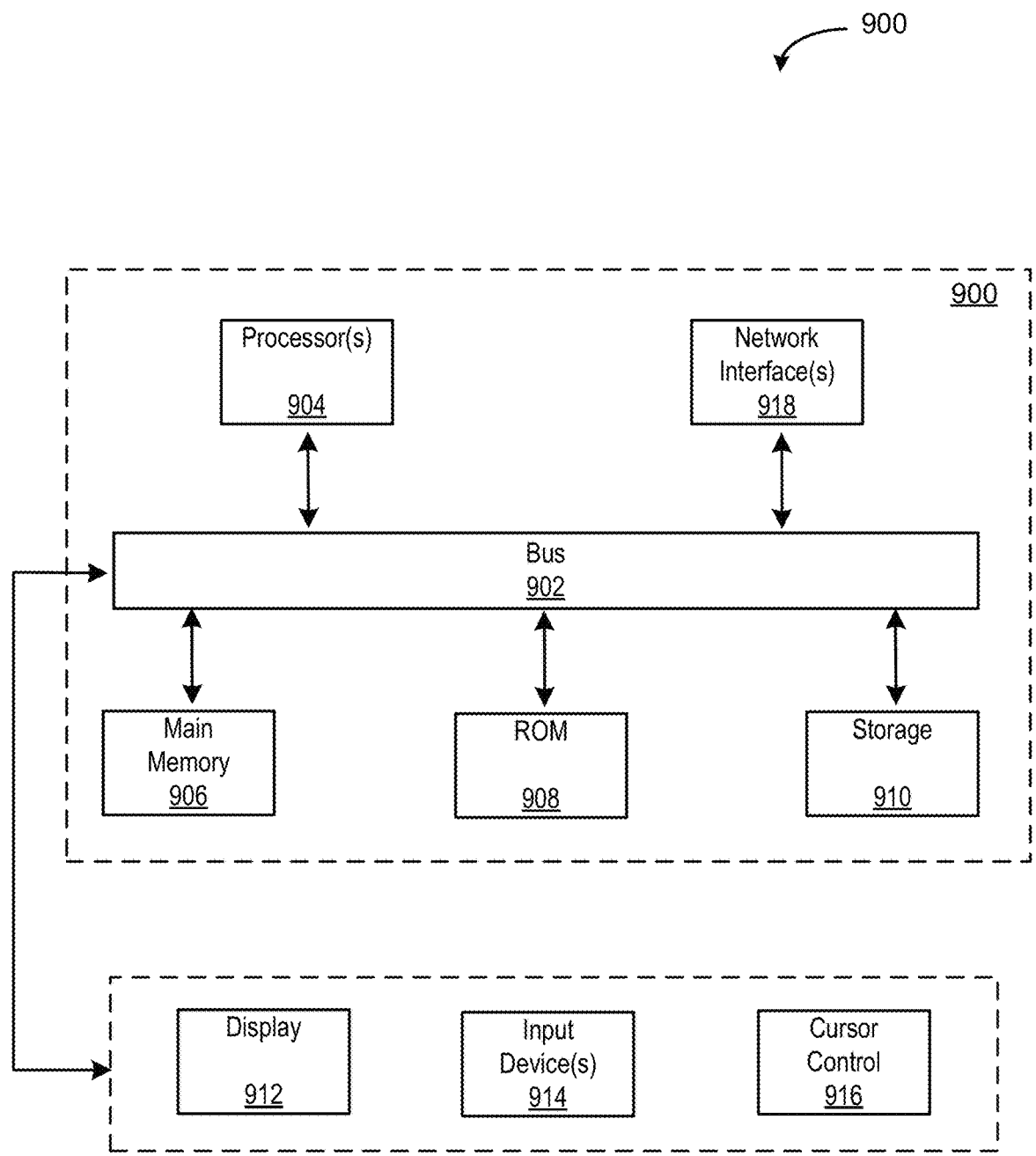
FIG. 9 depicts a block diagram of an example computer system in which various of the examples described herein may be implemented The figures are not exhaustive and do not limit the present disclosure to the precise form disclosed.

FIG. 9 depicts a block diagram of an example computer system 900 in which various of the examples described herein may be implemented. In various examples, computer system 900 (in combination with e.g., digital-to-analog converters) can be used to control/implement the signal conversions and adjustments described in conjunction with the preceding figures. In certain examples, computer system 900 may be used to program conductance states of memristors as well.

The computer system 900 includes a bus 912 or other communication mechanism for communicating information, one or more hardware processors 904 coupled with bus 912 for processing information. Hardware processor(s) 904 may be, for example, one or more general purpose microprocessors.

The computer system 900 also includes a main memory 906, such as a random access memory (RAM), cache and/or other dynamic storage devices, coupled to bus 912 for storing information and instructions to be executed by processor 904. Main memory 906 also may be used for storing temporary variables or other intermediate information during execution of instructions to be executed by processor 904. Such instructions, when stored in storage media accessible to processor 904, render computer system 900 into a special-purpose machine that is customized to perform the operations specified in the instructions.

The computer system 900 further includes a read only memory (ROM) 908 or other static storage device coupled to bus 912 for storing static information and instructions for processor 904. A storage device 910, such as a magnetic disk, optical disk, or USB thumb drive (Flash drive), etc., is provided and coupled to bus 912 for storing information and instructions.

The computer system 900 may be coupled via bus 912 to a display 912, such as a liquid crystal display (LCD) (or touch screen), for displaying information to a computer user. An input device 914, including alphanumeric and other keys, is coupled to bus 912 for communicating information and command selections to processor 904. Another type of user input device is cursor control 916, such as a mouse, a trackball, or cursor direction keys for communicating direction information and command selections to processor 904 and for controlling cursor movement on display 912. In some embodiments, the same direction information and command selections as cursor control may be implemented via receiving touches on a touch screen without a cursor.

The computing system 900 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," "data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor(s) 904 executing one or more sequences of one or more instructions contained in main memory 906. Such instructions may be read into main memory 906 from another storage medium, such as storage device 910. Execution of the sequences of instructions contained in main memory 906 causes processor(s) 904 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 910. Volatile media includes dynamic memory, such as main memory 906. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 912. Transmission media can also take the form of acoustic or light waves, such as those generated during radio-wave and infra-red data communications.

The computer system 900 also includes a communication interface 918 coupled to bus 912. Network interface 918 provides a two-way data communication coupling to one or more network links that are connected to one or more local networks. For example, communication interface 918 may be an integrated services digital network (ISDN) card, cable modem, satellite modem, or a modem to provide a data communication connection to a corresponding type of telephone line. As another example, network interface 918 may be a local area network (LAN) card to provide a data communication connection to a compatible LAN (or WAN component to communicated with a WAN). Wireless links may also be implemented. In any such implementation, network interface 918 sends and receives electrical, electromagnetic or optical indicators that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical indicators that carry digital data streams. The indicators through the various networks and the indicators on network link and through communication interface 918, which carry the digital data to and from computer system 900, are example forms of transmission media.

The computer system 900 can send messages and receive data, including program code, through the network(s), network link and communication interface 918. In the Internet example, a server might transmit a requested code for an application program through the Internet, the ISP, the local network and the communication interface 918.

The received code may be executed by processor 904 as it is received, and/or stored in storage device 910, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 900.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

As used herein, a dataset may refer to an ordered collection of data. As described above, a dataset may be a data-related product of a data processing pipeline.

As used herein, data analytics (which may be implemented using machine learning and/or artificial intelligence) may refer to techniques that make predictive determinations regarding, e.g., modeled scenarios and systems. As described above, analytical models derived from data are common data-related products of data processing pipelines.

As used herein, machine learning can refer to methods that, through the use of algorithms, are able to automatically turn datasets into analytical models. In turn, those analytical models are capable of making predictions based on patterns or inferences gleaned from other data/datasets. There has been a push to implement machine learning in enterprise environments, e.g., businesses, so that these entities may leverage machine learning to provide better services and products to their customers, become more efficient in their operations, etc. Implementing machine learning into the enterprise context, also referred to as operationalization, can involve the deployment (and management) of analytical models, i.e., putting analytical models into production.

As used herein, metadata may refer to data that provides information about other data. Within a data processing pipeline, each data-related product and processing step may have metadata associated with it. For example, metadata for a dataset may include textual documentation for the dataset, names of tables/columns/features of the dataset, descriptions of content within the dataset, data sizes within the dataset, data distributions within the dataset, etc. Examples of metadata for a processing step may include the language in which the processing step/program is written, information about input fields used for the processing step, contents of associated documentation for the processing step, class of algorithm used for the processing step, staging or quality assurance (QA) status for the processing step, names of developers/data scientists involved with the processing step, etc.

What is claimed is:

1. A circuit comprising:
a first aCAM sub-circuit electrically connected to a match line, the first aCAM sub-circuit having a programmed lower bound threshold voltage ($V_{T1L}$) and a programmed upper bound threshold voltage ($V_{T1H}$);
a second aCAM sub-circuit electrically connected to the match line, the second aCAM sub-circuit having a programmed lower bound threshold voltage ($V_{T2L}$) and a programmed upper bound threshold voltage ($V_{T2H}$); and;
a third aCAM sub-circuit electrically connected to the first and second aCAM sub-circuits, the third aCAM sub-circuit having a programmed lower bound threshold voltage ($V_{T3L}$) and a programmed upper bound threshold voltage ($V_{T3H}$);
wherein $V_{T1L}$, $V_{T1H}$, $V_{T2L}$, $V_{T2H}$, $V_{T3L}$, and $V_{T3H}$ are analog voltages based on conductance values of respective threshold values, wherein the threshold values corresponding to $V_{T1L}$, $V_{T1H}$, $V_{T2L}$, $V_{T2H}$, $V_{T3L}$, and $V_{T3H}$ are $T_{1L}$, $T_{1H}$, $T_{2L}$, $T_{2H}$, $T_{1L}+1$, and $T_{1H}-1$, respectively, wherein $T_{1L}$ is an integer value representing a lower bound threshold for the first aCAM sub-circuit, $T_{1H}$ is an integer value representing an upper bound threshold for the first aCAM sub-circuit, $T_{2L}$ is an integer value representing a lower bound threshold for the second aCAM sub-circuit, $T_{2H}$ is an integer value representing an upper bound threshold for the second aCAM sub-circuit, $T_{1L}+1$ is an integer value representing a lower bound threshold for the third aCAM sub-circuit, and wherein $T_{1H}-1$ is an integer value representing an upper bound threshold for the third aCAM sub-circuit, and wherein $V_{T1L}=w(f(T_{1L}))$, $V_{T1H}=w(f(T_{1H}))$, $V_{T2L}=w(f(T_{2L}))$, $V_{T2H}=w(f(T_{2H}))$, $V_{T3L}=w(f(T_{1L}+1))$, and $V_{T3H}=w(f(T_{1H}-1))$, where f is a function that converts integer values into conductance values, and w is a function that converts conductance values into analog voltage values, and
wherein, upon receiving an input signal (x), the circuit:
converts the input signal (x) into a first analog voltage signal ($V(x_{MSB})$) representing the most significant bits of the input signal (x) and a second analog voltage signal ($V(x_{LSB})$) representing the least significant bits of the input signal (x), wherein the first analog voltage signal ($V(x_{MSB})$) is received by the first and third aCAM sub-circuits and the second analog voltage signal ($V(x_{LSB})$) is received by the second aCAM sub-circuit, and
returns a match along the match line only when a pre-determined condition is met.

2. The circuit of claim 1, wherein the pre-determined condition comprises:

$\{((V(x_{MSB}) \geq V_{T1L}L)$ AND $(V(x_{LSB}) \geq V_{T2L}))$ OR $(V(x_{MSB}) \geq V_{T3L})\}$ AND $\{((V(x_{MSB}) \leq V_{T1H})$ AND $(V(x_{LSB}) \leq V_{T2H}))$ OR $(V(x_{MSB}) \leq V_{T3H})\}$.

3. The circuit of claim 2, wherein:
the first aCAM sub-circuit comprises a first memristor and a second memristor;
the second aCAM sub-circuit comprises a third memristor and a fourth memristor; and the third aCAM sub-circuit comprises a fifth memristor and a sixth memristor;

wherein each of the first-sixth memristors has M programmable bits, wherein the M programmable bits of a given memristor are programmed by tuning conductance of the given memristor.

4. The circuit of claim 1, wherein:

the programmed lower bound threshold voltage ($V_{T1L}$) of the first aCAM sub-circuit is programmed by tuning conductance of the first memristor such that $V_{T1L}=w(f(T_{1L}))$;

the programmed upper bound threshold voltage ($V_{T1H}$) of the first aCAM sub-circuit is programmed by tuning conductance of the second memristor such that $V_{T1H}=w(f(T_{1H}))$;

the programmed lower bound threshold voltage ($V_{T2L}$) of the second aCAM sub-circuit is programmed by tuning conductance of the third memristor such that $V_{T2L}=w(f(T_{2L}))$;

the programmed upper bound threshold voltage ($V_{T2H}$) of the second aCAM sub-circuit is programmed by tuning conductance of the fourth memristor such that $V_{T2H}=w(f(T_{2H}))$;

the programmed lower bound threshold voltage ($V_{T3L}$) of the third aCAM sub-circuit is programmed by tuning conductance of the fifth memristor such that $V_{T3L}=w(f(T_{1L}+1))$; and the programmed upper bound threshold voltage ($V_{T3H}$) of the third aCAM sub-circuit is programmed by tuning conductance of the sixth memristor such that $V_{T3H}=w(f(T_{1H}-1))$.

5. The circuit of claim 4, wherein:

the first aCAM sub-circuit further comprises:
 a first pull-down transistor electrically connected to the match line and the first memristor; and
 a second pull-down transistor electrically connected to the match line and an output of a first inverter, wherein the second memristor is electrically connected to an input of the first inverter;

the second aCAM sub-circuit further comprises:
 a third pull-down transistor electrically connected to the match line and the third memristor; and
 a fourth pull-down transistor electrically connected to the match line and an output of a second inverter, wherein the fourth memristor is electrically connected to an input of the second inverter; and the third aCAM sub-circuit further comprises:
 a fifth pull-down transistor electrically connected to the first pull-down transistor, the third pull-down transistor, and the fifth memristor; and
 a sixth pull-down transistor electrically connected to the second pull-down transistor, the fourth pull-down transistor, and an output of a third inverter, wherein the sixth memristor is electrically connected to an input of the third inverter.

6. The circuit of claim 5, wherein the circuit returns a mismatch along the match line when at least one of the following conditions is met:

the first pull-down transistor is activated AND the fifth pull-down transistor is activated;
the second pull-down transistor is activated AND the sixth pull-down transistor is activated;
the third pull-down transistor is activated AND the fifth pull-down transistor is activated; and
the fourth pull-down transistor is activated AND the sixth pull-down transistor is activated.

7. The circuit of claim 3, wherein the circuit comprises $2^{2M}$ programmable levels, where M represents the number of programmable bits for a given memristor of the first-sixth memristors.

8. A circuit comprising:

a first aCAM sub-circuit electrically connected to a match line, the first aCAM sub-circuit having a programmed lower bound threshold voltage ($V_{T1L}$) and a programmed upper bound threshold voltage ($V_{T1H}$);

a second aCAM sub-circuit electrically connected to the match line, the second aCAM sub-circuit having a programmed lower bound threshold voltage ($V_{T2L}$) and a programmed upper bound threshold voltage ($V_{T2H}$);

a third aCAM sub-circuit electrically connected to the second aCAM sub-circuit, the third aCAM sub-circuit having a programmed lower bound threshold voltage ($V_{T3L}$) and a programmed upper bound threshold voltage ($V_{T3H}$);

wherein $V_{T1L}$, $V_{T1H}$, $V_{T2L}$, $V_{T2H}$, $V_{T3L}$, and $V_{T3H}$ are analog voltages based on conductance values of respective threshold values, wherein the threshold values corresponding to $V_{T1L}$, $V_{T1H}$, $V_{T2L}$, $V_{T2H}$, $V_{T3L}$, and $V_{T3H}$ are $T_{1L}$, $T_{1H}$, $T_{2L}$, $T_{2H}$, $T_{1L}+1$, and $T_{1H}-1$, respectively, wherein $T_{1L}$ is an integer value representing a lower bound threshold for the first aCAM sub-circuit, $T_{1H}$ is an integer value representing an upper bound threshold for the first aCAM sub-circuit, $T_{2L}$ is an integer value representing a lower bound threshold for the second aCAM sub-circuit, $T_{2H}$ is an integer value representing an upper bound threshold for the second aCAM sub-circuit, $T_{1L}+1$ is an integer value representing a lower bound threshold for the third aCAM sub-circuit, and wherein $T_{1H}-1$ is an integer value representing an upper bound threshold for the third aCAM sub-circuit, and wherein $V_{T1L}=w(f(T_{1L}))$, $V_{T1H}=W(f(T_{1H}))$, $V_{T2L}=W(f(T_{2L}))$, $V_{T2H}=W(f(T_{2H}))$, $V_{T3L}=w(f(T_{1L}+1))$, and $V_{T3H}=w(f(T_{1H}-1))$, where f is a function that converts integer values into conductance values, and w is a function that converts conductance values into analog voltage values, and wherein, upon receiving a digital input signal (x), the circuit:
 converts the digital input signal (x) into a first analog voltage signal ($V(x_{MSB})$) representing the most significant bits of the digital input signal (x) and a second analog voltage signal ($V(x_{LSB})$) representing the least significant bits of the digital input signal (x), wherein the first analog voltage signal ($V(x_{MSB})$) is received by the first and third aCAM sub-circuits and the second analog voltage signal ($V(x_{LSB})$) is received by the second aCAM sub-circuit, and
 returns a match along the match line only when a pre-determined condition is met.

9. The circuit of claim 8, wherein the predetermined condition comprises:

$$\{(V(x_{MSB}) \geq V_{T1L}L) \text{ AND } ((V(x_{LSB}) \geq V_{T2L})) \text{ OR } (V(x_{MSB}) \geq V_{T3L}))\} \text{ AND } \{(V(x_{MSB}) \leq V_{T1H}) \text{ AND } ((V(x_{LSB}) \leq V_{T2H}) \text{ OR } (V(x_{MSB}) \leq V_{T3H}))\}.$$

10. The circuit of claim 9, wherein:

the first aCAM sub-circuit comprises a first memristor and a second memristor;
the second aCAM sub-circuit comprises a third memristor and a fourth memristor;
the third aCAM sub-circuit comprises a fifth memristor and a sixth memristor;

wherein each of the first-sixth memristors has M programmable bits, wherein the M programmable bits of a given memristor are programmed by tuning conductance of the given memristor.

11. The circuit of claim 8, wherein:
the first aCAM sub-circuit further comprises:
   a first pull-down transistor electrically connected to the match line and the first memristor; and
   a second pull-down transistor electrically connected to the match line and an output of a first inverter, wherein the second memristor is electrically connected to an input of the first inverter;
the second aCAM sub-circuit further comprises:
   a third pull-down transistor electrically connected to the match line and the third memristor; and
   a fourth pull-down transistor electrically connected to the match line and an output of a second inverter, wherein the fourth memristor is electrically connected to an input of the second inverter; and
the third aCAM sub-circuit further comprises:
   a fifth pull-down transistor electrically connected to the third pull-down transistor and the fifth memristor; and
   a sixth pull-down transistor connecting electrically connected to the fourth pull-down transistor and an output of a third inverter, wherein the sixth memristor is electrically connected to an input of the third inverter.

12. The circuit of claim 11, wherein the circuit returns a mismatch along the match line when at least one of the following conditions is met:
the first pull-down transistor is activated;
the second pull-down transistor is activated;
the third pull-down transistor is activated AND the fifth pull-down transistor is activated; and
the fourth pull-down transistor is activated AND the sixth pull-down transistor is activated.

13. The circuit of claim 12, wherein the circuit returns a mismatch along the match line when voltage of the match line is discharged.

14. The circuit of claim 10, wherein:
the first aCAM sub-circuit further comprises:
   a first pull-up transistor electrically connected to the match line and the first memristor; and
   a second pull-up transistor electrically connected to the match line and an output of a first inverter, wherein the second memristor is electrically connected to an input of the first inverter;
the second aCAM sub-circuit further comprises:
   a third pull-up transistor electrically connected to the match line and the third memristor, wherein the third pull-up transistor is also electrically connected, in parallel, to a fifth pull-up transistor of the third aCAM sub-circuit; and
   a fourth pull-up transistor electrically connected to the match line and an output of a second inverter, wherein the fourth memristor is electrically connected to an input of the second inverter and the fourth pull-up transistor is also electrically connected, in parallel, to a sixth pull-up transistor of the third aCAM sub-circuit; and
the third aCAM sub-circuit further comprises:
   the fifth pull-up transistor electrically connected to the match line and the fifth memristor, wherein the fifth pull-up transistor is also electrically connected, in parallel, to the third pull-up transistor; and
   the sixth pull-up transistor electrically connected to the match line and an output of a third inverter, wherein the sixth memristor is electrically connected to an input of the third inverter and the sixth pull-up transistor is also electrically connected, in parallel, to the fourth pull-up transistor.

15. The circuit of claim 10, wherein the circuit comprises $2^{2M}$ programmable levels, where M represents a number of bits that can be programmed for a given memristor of the first-sixth memristors.

* * * * *